United States Patent
Kawasuji et al.

(10) Patent No.: US 10,224,686 B2
(45) Date of Patent: Mar. 5, 2019

(54) LASER APPARATUS, EUV LIGHT GENERATION SYSTEM, AND METHOD OF CONTROLLING LASER APPARATUS

(71) Applicant: GIGAPHOTON INC., Tochigi (JP)

(72) Inventors: Yasufumi Kawasuji, Oyama (JP); Naoya Takaoka, Oyama (JP); Toshio Yokozuka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/356,763

(22) Filed: Nov. 21, 2016

(65) Prior Publication Data
US 2017/0070024 A1 Mar. 9, 2017

Related U.S. Application Data

(63) Continuation of application No. PCT/JP2015/068468, filed on Jun. 26, 2015.

(30) Foreign Application Priority Data

Jul. 1, 2014 (WO) .................. PCT/JP2014/067509

(51) Int. Cl.
*H01S 3/102* (2006.01)
*H01S 3/13* (2006.01)
(Continued)

(52) U.S. Cl.
CPC ............ *H01S 3/102* (2013.01); *H01L 21/027* (2013.01); *H01L 21/67115* (2013.01);
(Continued)

(58) Field of Classification Search
CPC ...... H01S 3/102; H01S 3/1301; H01S 3/1305; H05G 2/008
See application file for complete search history.

(56) References Cited

U.S. PATENT DOCUMENTS

| 7,928,416 B2 | 4/2011 | Fomenkov |
| 2006/0239309 A1* | 10/2006 | Ariga .................. G03F 7/70041 372/29.021 |

(Continued)

FOREIGN PATENT DOCUMENTS

| JP | S62-224092 A | 10/1987 |
| JP | H01-101681 A | 4/1989 |

(Continued)

OTHER PUBLICATIONS

International Search Report; PCT/JP2015/068468 dated Sep. 1, 2015.

*Primary Examiner* — Nicole M Ippolito
*Assistant Examiner* — Sean M Luck
(74) *Attorney, Agent, or Firm* — Studebaker & Brackett PC

(57) ABSTRACT

A laser apparatus may include: an optical amplifier configured to amplify a laser beam outputted from a master oscillator; an optical-amplifier power supply configured to supply an alternating current for optical amplification to the optical amplifier; and a laser controller. The optical-amplifier power supply may include: an alternating current generation circuit including an inverter circuit configured to change output amplitude in accordance with a duty cycle, the alternating current generation circuit being configured to generate the alternating current from an output of the inverter circuit; and a power supply control circuit configured to hold control information defining correspondence relations between command values from the laser controller and duty cycles of the inverter circuit, determine a duty cycle corresponding to a command value received from the laser controller based on the control information, and provide the determined duty cycle to the inverter circuit.

15 Claims, 28 Drawing Sheets

(51) Int. Cl.
  *H01S 3/10* (2006.01)
  *H01L 21/027* (2006.01)
  *H01S 3/097* (2006.01)
  *H01L 21/67* (2006.01)
  *H01S 3/09* (2006.01)
  *H01S 3/104* (2006.01)
  *H01S 3/23* (2006.01)
  *H05G 2/00* (2006.01)
  *H01S 3/134* (2006.01)
  *H01S 3/223* (2006.01)
  *H01S 5/34* (2006.01)
  *H01S 5/40* (2006.01)

(52) U.S. Cl.
  CPC ............... *H01S 3/09* (2013.01); *H01S 3/097* (2013.01); *H01S 3/09702* (2013.01); *H01S 3/104* (2013.01); *H01S 3/2308* (2013.01); *H05G 2/008* (2013.01); *H01S 3/134* (2013.01); *H01S 3/2232* (2013.01); *H01S 3/2316* (2013.01); *H01S 3/2325* (2013.01); *H01S 3/2375* (2013.01); *H01S 5/3401* (2013.01); *H01S 5/4012* (2013.01)

(56) References Cited

U.S. PATENT DOCUMENTS

| | | | | |
|---|---|---|---|---|
| 2008/0115342 | A1* | 5/2008 | Fujimoto | H01S 3/10092 29/428 |
| 2012/0193547 | A1* | 8/2012 | Hansson | H05G 2/003 250/372 |
| 2013/0051412 | A1 | 2/2013 | Miyao et al. | |
| 2013/0094529 | A1 | 4/2013 | Wakabayashi | |
| 2013/0099140 | A1 | 4/2013 | Nakarai et al. | |

FOREIGN PATENT DOCUMENTS

| | | |
|---|---|---|
| JP | H01-191490 A | 8/1989 |
| JP | H02-025085 A | 1/1990 |
| JP | H09-184900 A | 7/1997 |
| JP | 2003-243749 A | 8/2003 |
| JP | 2004-047538 A | 2/2004 |
| JP | 2006-128157 A | 5/2006 |
| JP | 2012-191171 A | 10/2012 |
| JP | 2012-216768 A | 11/2012 |
| JP | 2013-089788 A | 5/2013 |
| WO | 2011/013297 A1 | 2/2011 |
| WO | 2012/131452 A1 | 10/2012 |
| WO | 2012/131455 A1 | 10/2012 |

\* cited by examiner

| GATE CONTROL TABLE 389 ||
|---|---|
| CURRENT COMMAND VALUE: IC | ON-TIME LENGTH: G |
| IC1 | G1 |
| IC2 | G2 |
| IC3 | G3 |
| ⋮ | ⋮ |
| ICl | Gl |
FIG. 7
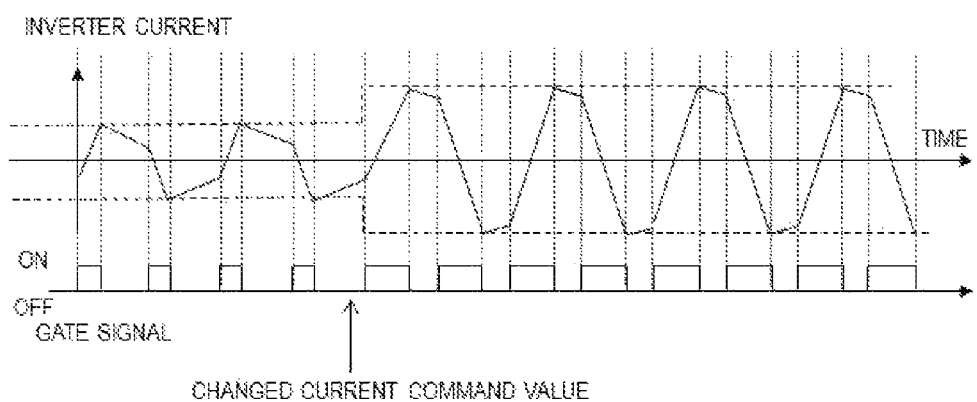
FIG. 8
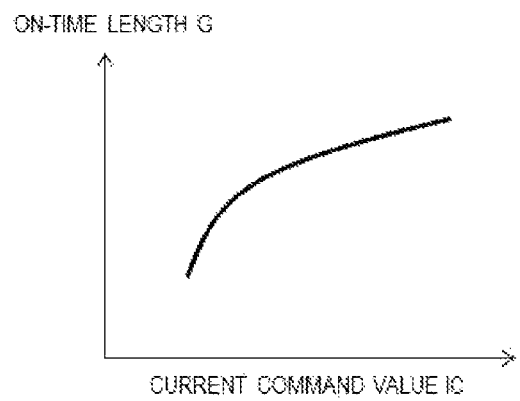
FIG. 9

| CURRENT CONTROL TABLE | 451 |
|---|---|
| PULSE ENERGY COMMAND VALUE: Pt | CURRENT COMMAND VALUE: IC |
| Pt1 | IC1 |
| Pt2 | IC2 |
| Pt3 | IC3 |
| ⋮ | ⋮ |
| Pti | ICi |

| GATE CONTROL TABLE 621 | | | | | | |
|---|---|---|---|---|---|---|
| PULSE ENERGY COMMAND VALUE | Pt1 | Pt2 | Pt3 | Pt4 | Pt5 | ... | Pti |
| CURRENT COMMAND VALUE FOR PA 614-1 | AMP1IC1 | AMP1IC2 | AMP1IC3 | AMP1IC4 | AMP1IC5 | ... | AMP1ICi |
| CURRENT COMMAND VALUE FOR PA 614-2 | AMP2IC1 | AMP2IC2 | AMP2IC3 | AMP2IC4 | AMP2IC5 | ... | AMP2ICi |
| CURRENT COMMAND VALUE FOR PA 614-3 | AMP3IC1 | AMP3IC2 | AMP3IC3 | AMP3IC4 | AMP3IC5 | ... | AMP3ICi |
| CURRENT COMMAND VALUE FOR PA 614-4 | AMP4IC1 | AMP4IC2 | AMP4IC3 | AMP4IC4 | AMP4IC5 | ... | AMP4ICi |

| OPERATING PARAMETER TABLE 681 | | | | | | |
|---|---|---|---|---|---|---|
| EUV PULSE ENERGY COMMAND VALUE | Et1 | Et2 | Et3 | Et4 | Et5 | ... | Etk |
| TARGET ENERGY FOR MO | MOEt1 | MOEt2 | MOEt3 | MOEt4 | MOEt5 | ... | MOEtl |
| TARGET ENERGY FOR PA 614-1 | AMP1Et1 | AMP1Et2 | AMP1Et3 | AMP1Et4 | AMP1Et5 | ... | AMP1Etl |
| TARGET ENERGY FOR PA 614-2 | AMP2Et1 | AMP2Et2 | AMP2Et3 | AMP2Et4 | AMP2Et5 | ... | AMP2Etl |
| TARGET ENERGY FOR PA 614-3 | AMP3Et1 | AMP3Et2 | AMP3Et3 | AMP3Et4 | AMP3Et5 | ... | AMP3Etl |
| TARGET ENERGY FOR PA 614-4 | AMP4Et1 | AMP4Et2 | AMP4Et3 | AMP4Et4 | AMP4Et5 | ... | AMP4Etl |
| EXCITING CURRENT FOR MO | MOIC1 | MOIC2 | MOIC3 | MOIC4 | MOIC5 | ... | MOICl |
| CURRENT COMMAND VALUE FOR PA 614-1 | AMP1IC1 | AMP1IC2 | AMP1IC3 | AMP1IC4 | AMP1IC5 | ... | AMP1ICl |
| CURRENT COMMAND VALUE FOR PA 614-2 | AMP2IC1 | AMP2IC2 | AMP2IC3 | AMP2IC4 | AMP2IC5 | ... | AMP2ICl |
| CURRENT COMMAND VALUE FOR PA 614-3 | AMP3IC1 | AMP3IC2 | AMP3IC3 | AMP3IC4 | AMP3IC5 | ... | AMP3ICl |
| CURRENT COMMAND VALUE FOR PA 614-4 | AMP4IC1 | AMP4IC2 | AMP4IC3 | AMP4IC4 | AMP4IC5 | ... | AMP4ICl |

*FIG. 16*

| CORRECTED CURRENT COMMAND VALUE TABLE FOR PA 614-1 691-1 | | | | | | |
|---|---|---|---|---|---|---|
| PULSE ENERGY COMMAND VALUE: Pt | Pt1 | Pt2 | Pt3 | Pt4 | Pt5 | ... | Ptk |
| CURRENT COMMAND VALUE FOR PA 614-1 | AMP1IC1 | AMP1IC2 | AMP1IC3 | AMP1IC4 | AMP1IC5 | ... | AMP1ICk |
| GAS DETERIORATION LEVEL 1 | AMP1IC1-1 | AMP1IC2-1 | AMP1IC3-1 | AMP1IC4-1 | AMP1IC5-1 | ... | AMP1ICk-1 |
| GAS DETERIORATION LEVEL 2 | AMP1IC1-2 | AMP1IC2-2 | AMP1IC3-2 | AMP1IC4-2 | AMP1IC5-2 | ... | AMP1ICk-2 |
| GAS DETERIORATION LEVEL 3 | AMP1IC1-3 | AMP1IC2-3 | AMP1IC3-3 | AMP1IC4-3 | AMP1IC5-3 | ... | AMP1ICk-3 |

*FIG. 30A*

| CORRECTED CURRENT COMMAND VALUE TABLE FOR PA 614-2 691-2 | | | | | | |
|---|---|---|---|---|---|---|
| PULSE ENERGY COMMAND VALUE: Pt | Pt1 | Pt2 | Pt3 | Pt4 | Pt5 | ... | Ptk |
| CURRENT COMMAND VALUE FOR PA 614-2 | AMP2IC1 | AMP2IC2 | AMP2IC3 | AMP2IC4 | AMP2IC5 | ... | AMP2ICk |
| GAS DETERIORATION LEVEL 1 | AMP2IC1-1 | AMP2IC2-1 | AMP2IC3-1 | AMP2IC4-1 | AMP2IC5-1 | ... | AMP2ICk-1 |
| GAS DETERIORATION LEVEL 2 | AMP2IC1-2 | AMP2IC2-2 | AMP2IC3-2 | AMP2IC4-2 | AMP2IC5-2 | ... | AMP2ICk-2 |
| GAS DETERIORATION LEVEL 3 | AMP2IC1-3 | AMP2IC2-3 | AMP2IC3-3 | AMP2IC4-3 | AMP2IC5-3 | ... | AMP2ICk-3 |

*FIG. 30B*

| CORRECTED CURRENT COMMAND VALUE TABLE FOR PA 614-3 _691-3_ | | | | | | |
|---|---|---|---|---|---|---|
| PULSE ENERGY COMMAND VALUE: Pt | Pt1 | Pt2 | Pt3 | Pt4 | Pt5 | ... | Ptk |
| CURRENT COMMAND VALUE FOR PA 614-3 | AMP3IC1 | AMP3IC2 | AMP3IC3 | AMP3IC4 | AMP3IC5 | ... | AMP3ICk |
| GAS DETERIORATION LEVEL 1 | AMP3IC1-1 | AMP3IC2-1 | AMP3IC3-1 | AMP3IC4-1 | AMP3IC5-1 | ... | AMP3ICk-1 |
| GAS DETERIORATION LEVEL 2 | AMP3IC1-2 | AMP3IC2-2 | AMP3IC3-2 | AMP3IC4-2 | AMP3IC5-2 | ... | AMP3ICk-2 |
| GAS DETERIORATION LEVEL 3 | AMP3IC1-3 | AMP3IC2-3 | AMP3IC3-3 | AMP3IC4-3 | AMP3IC5-3 | ... | AMP3ICk-3 |

FIG. 30C

| CORRECTED CURRENT COMMAND VALUE TABLE FOR PA 614-4 _691-4_ | | | | | | |
|---|---|---|---|---|---|---|
| PULSE ENERGY COMMAND VALUE: Pt | Pt1 | Pt2 | Pt3 | Pt4 | Pt5 | ... | Ptk |
| CURRENT COMMAND VALUE FOR PA 614-4 | AMP4IC1 | AMP4IC2 | AMP4IC3 | AMP4IC4 | AMP4IC5 | ... | AMP4ICk |
| GAS DETERIORATION LEVEL 1 | AMP4IC1-1 | AMP4IC2-1 | AMP4IC3-1 | AMP4IC4-1 | AMP4IC5-1 | ... | AMP4ICk-1 |
| GAS DETERIORATION LEVEL 2 | AMP4IC1-2 | AMP4IC2-2 | AMP4IC3-2 | AMP4IC4-2 | AMP4IC5-2 | ... | AMP4ICk-2 |
| GAS DETERIORATION LEVEL 3 | AMP4IC1-3 | AMP4IC2-3 | AMP4IC3-3 | AMP4IC4-3 | AMP4IC5-3 | ... | AMP4ICk-3 |

FIG. 30D

LASER APPARATUS, EUV LIGHT GENERATION SYSTEM, AND METHOD OF CONTROLLING LASER APPARATUS

CROSS-REFERENCE TO RELATED APPLICATIONS

The present application is a continuation application of International Application No. PCT/JP2015/068468 filed on Jun. 26, 2015, which claims priority from International application No. PCT/JP2014/067509 filed Jul. 1, 2014, the content of which is hereby incorporated by reference into this application.

BACKGROUND

1. Technical Field

The present disclosure relates to a laser apparatus, an extreme ultraviolet light generation system, and a method of controlling the laser apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, an exposure apparatus is needed in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

An example of the present disclosure may be a laser apparatus configured to generate a pulse laser beam. The laser apparatus may include: a master oscillator configured to output a pulse laser beam; an optical amplifier configured to amplify the laser beam outputted from the master oscillator; an optical-amplifier power supply configured to supply an alternating current for optical amplification to the optical amplifier; and a laser controller configured to control the master oscillator and the optical-amplifier power supply. The optical-amplifier power supply may include: an alternating current generation circuit including an inverter circuit configured to change output amplitude in accordance with a duty cycle, the alternating current generation circuit being configured to generate the alternating current from an output of the inverter circuit; and a power supply control circuit configured to hold control information defining correspondence relations between command values from the laser controller and duty cycles of the inverter circuit, determine a duty cycle corresponding to a command value received from the laser controller based on the control information, and provide the determined duty cycle to the inverter circuit.

BRIEF DESCRIPTION OF THE DRAWINGS

Hereinafter, selected embodiments of the present disclosure will be described with reference to the accompanying drawings.

FIG. 7 illustrates a configuration example of a gate control table.

FIG. 8 illustrates temporal variation of a gate signal from a PA power supply control circuit and an inverter current.

FIG. 9 illustrates a relation between current command value and ON-time length of the gate signal.

FIG. 16 illustrates a configuration example of an operating parameter table.

FIG. 30A is a corrected current command value table for an optical amplifier.

FIG. 30B is a corrected current command value table for an optical amplifier.

FIG. 30C is a corrected current command value table for an optical amplifier.

FIG. 30D is a corrected current command value table for an optical amplifier.

DETAILED DESCRIPTION

Figure 1:
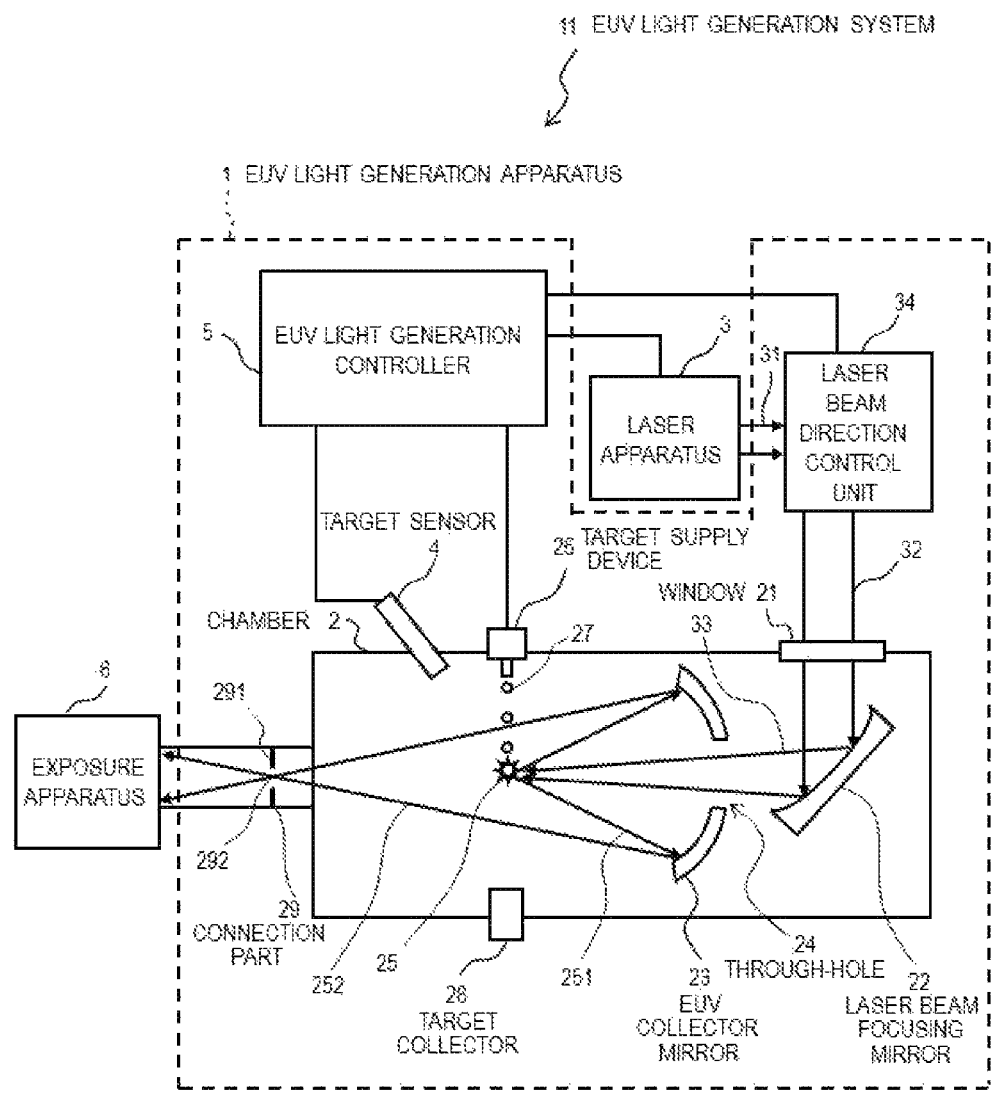
FIG. 1 schematically illustrates a configuration of an exemplary LPP type EUV light generation system.

Contents
1. Overview
2. Terms
3. Overview of EUV Light Generation System
   3.1 Configuration
   3.2 Operation
<Embodiment 1>
4. Laser Processing Machine
   4.1 Configuration of Laser Processing Machine
   4.2 Operation of Laser Processing Machine
   4.3 Configuration and Operation of Laser Apparatus
   4.4 Issues on PA Power Supply of Comparative Example
   4.5 PA Power Supply of Present Embodiment
5. Laser Controller
   5.1 Current Control Table
   5.2 Operation
   5.3 Effects
<Embodiment 2>
6. EUV Light Generation System
   6.1 Configuration
   6.2 Operation
   6.3 Effects
<Embodiment 3>
7. Another Example of EUV Light Generation System
   7.1 Configuration
   7.2 Operation
<Embodiment 4>
8. Another Example of Laser Control
   8.1 Burst Operation
   8.2 Issues
   8.3 Configuration
   8.4 Operation
   8.5 Effects <Embodiment 5>
9. Another Example of Laser Control
   9.1 Overview
   9.2 Configuration
   9.3 Operation
   9.4 Effects Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview

An LPP type EUV light generation system may generate EUV light by irradiating targets with a laser beam outputted from a laser apparatus to turn the targets into plasma. The LPP type EUV light generation system for an exposure apparatus may generate EUV light at a high cyclic frequency of 50 to 100 kHz or higher and control the energy of the EUV light pulse by pulse. Controlling the energy of EUV light pulse by pulse may be performed by controlling the pulse energy of the laser beam outputted from the laser apparatus pulse by pulse.

The laser apparatus may include a master oscillator and an optical amplifier for amplifying the pulse laser beam outputted from the master oscillator. To control the energy of EUV light pulse by pulse, high-speed control of the gain of the optical amplifier may be requested. In other usages of the laser apparatus, for example a laser processing machine, a laser apparatus including a master oscillator and an optical amplifier for amplifying the pulse laser beam outputted from the master oscillator may be used and high-speed control of the gain of the optical amplifier may be requested.

A laser apparatus in an aspect of the present disclosure may include an optical amplifier for amplifying a laser beam outputted from the master oscillator, an optical-amplifier power supply for supplying an alternating current for the optical amplification to the optical amplifier, and a laser controller. The optical-amplifier power supply may include an inverter circuit and a power supply control circuit. The power supply control circuit may include control information defining correspondence relations between command values from the laser controller and duty cycles of the inverter circuit. The power supply control circuit may determine a duty cycle corresponding to a command value received from the laser controller using the control information and apply the determined duty cycle to the inverter circuit.

The laser apparatus of this disclosure may apply a duty cycle to the inverter circuit without feedback control based on the output current of the inverter circuit to achieve high-speed control of the pulse energy outputted from the optical amplifier. The laser apparatus of this disclosure applied to an LPP type EUV light generation system may enable more accurate pulse-by-pulse control of the energy of EUV light.

2. Terms

A term used in the present disclosure will be described hereinafter. The information used to determine a value for an input value may include functions as well as tables and databases.

3. Overview of EUV Light Generation System

3.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 26. The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or any combination thereof.

The chamber 2 may have at least one through-hole formed in its wall, and the pulse laser beam 32 from the laser apparatus 3 may travel through the wall. The chamber 2 may have at least one window 21, and the pulse laser beam 32 from the laser apparatus 3 may travel through the window 21. An EUV collector mirror 23 having a spheroidal surface may, for example, be provided in the chamber 2. The EUV collector mirror 23 may have a first focus and a second focus. The EUV collector mirror 23 may have a multi-layered reflective film including alternately laminated molybdenum layers and silicon layers formed on the surface thereof. The EUV collector mirror 23 is preferably positioned such that the first focus lies in a plasma generation region 25 and the second focus lies in an intermediate focus (IF) region 292. The EUV collector mirror 23 may have a through-hole 24 formed at the center thereof and a pulse laser beam 33 may travel through the through-hole 24.

The EUV light generation apparatus 1 may include an EUV light generation controller 5 and a target sensor 4. The target sensor 4 may have an imaging function and detect at least one of the presence, trajectory, position, and speed of a target.

Further, the EUV light generation system 11 may include a connection part 29 for allowing the interior of the chamber 2 to be in communication with the interior of the exposure apparatus 6. A wall 291 having an aperture may be provided in the connection part 29. The wall 291 may be positioned such that the second focus of the EUV collector mirror 23 lies in the aperture.

The EUV light generation apparatus 1 may also include a laser beam direction control unit 34, a laser beam focusing mirror 22, and a target collector 28 for collecting targets 27. The laser beam direction control unit 34 may include an optical element for defining the direction and an actuator for adjusting the position, the orientation or posture, and the like of the optical element.

3.2 Operation

With reference to FIG. 1, a pulse laser beam 31 outputted from the laser apparatus 3 may pass through the laser beam direction control unit 34 and, as the pulse laser beam 32, travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and rays of light 251 may be emitted from the plasma. The EUV light 251 may be reflected and focused by the EUV collector mirror 23. EUV light 252 reflected by the EUV collector mirror 23 may be focused at the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control: the timing when the target 27 is outputted and the direction into which the target 27 is outputted, for example. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

Embodiment 1

4. Laser Processing Machine

4.1 Configuration of Laser Processing Machine

Figure 2:
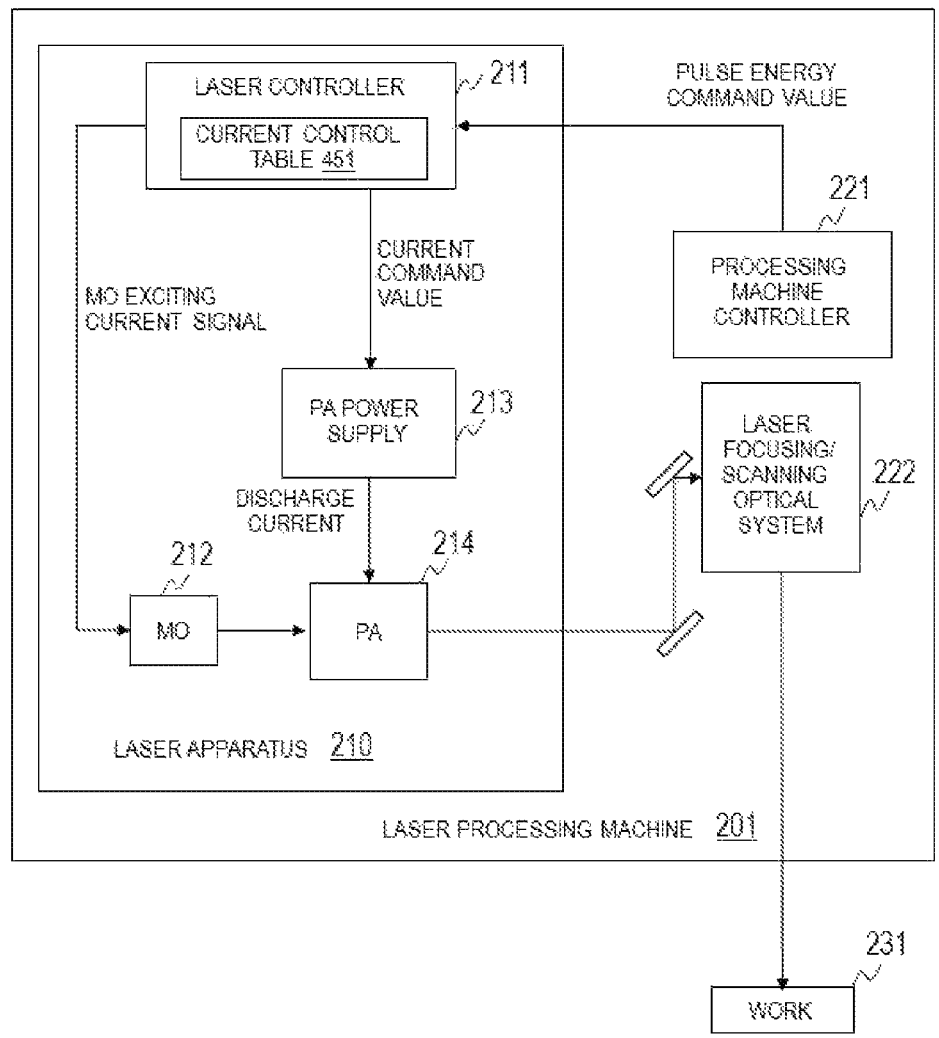
FIG. 2 illustrates a configuration example of a laser processing machine in Embodiment 1.

FIG. 2 illustrates a configuration example of a laser processing machine 201 in the present embodiment. The laser processing machine 201 may include a processing machine controller 221, a laser apparatus 210, and a laser focusing/scanning optical system 222. The laser apparatus 210 may include a laser controller 211, a master oscillator (MO) 212, a PA power supply 213, and an optical amplifier (PA) 214.

The master oscillator 212 may include a solid-state laser, inclusive of semiconductor lasers (QCLs: quantum cascade lasers), or a $CO_2$ laser. The master oscillator 212 may output a laser beam including an amplifying range wavelength of the amplification medium.

The optical amplifier 214 may be disposed on the optical path of the laser beam outputted from the master oscillator 212. The optical amplifier 214 may be a laser amplifier containing a gas for the laser medium. The laser medium may be $CO_2$. The optical amplifier 214 may be connected with the PA power supply 213.

The laser controller 211 may include a current control table 451. The laser controller 211 may be connected with the master oscillator 212 and the PA power supply 213. The laser controller 211 may be connected with the processing machine controller 221. The laser controller 211 may include a current source for oscillating the master oscillator 212.

4.2 Operation of Laser Processing Machine

The laser processing machine 201 may irradiate a work 231 with a laser beam outputted from the laser apparatus 210 through the laser focusing/scanning optical system 222 to process the work 231. The laser controller 211 may supply an exciting current to the master oscillator 212 to emit a laser beam oscillated at a predetermined cyclic frequency, predetermined intervals, and a predetermined intensity.

The laser controller 211 may acquire a pulse energy command value from the processing machine controller 221. The pulse energy command value may specify the pulse energy of the laser beam required by the laser processing machine 201.

The laser controller 211 may determine a current command value corresponding to the pulse energy command value with reference to the current control table 451. The laser controller 211 may send the current command value corresponding to the pulse energy command value to the PA power supply 213.

The current command value may specify a value for the inverter current in the PA power supply 213 or the discharge current from the PA power supply 213, for example. The PA power supply 213 may supply a discharge current based on the current command value to the optical amplifier 214. The laser beam outputted from the master oscillator 212 may be amplified to have predetermined pulse energy in the optical amplifier 214 with the specified discharge current and outputted.

The laser focusing/scanning optical system 222 may receive the laser beam outputted from the optical amplifier 214. The laser focusing/scanning optical system 222 may focus or scan the laser beam onto the work 231. The laser beam applied to the work 231 by the laser focusing/scanning optical system 222 may have predetermined pulse energy to process the work 231.

4.3 Configuration and Operation of Laser Apparatus

4.3-1 Configuration and Operation of Triaxial Cross Flow Amplifier

Figure 3A:
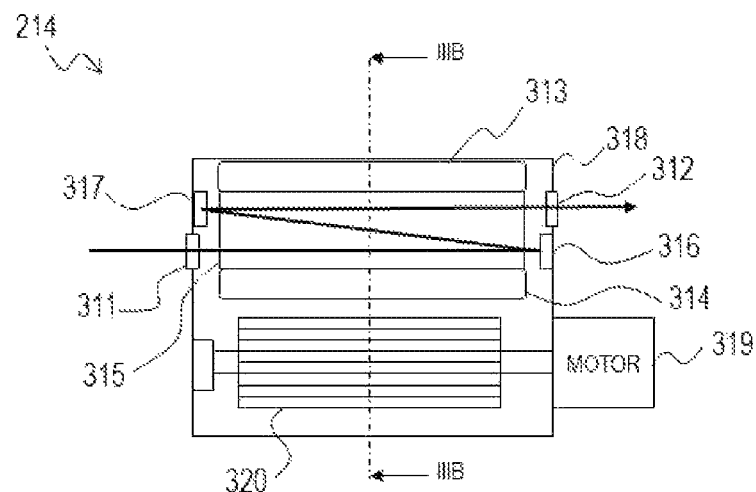
FIG. 3A is a side elevation diagram of a triaxial cross flow amplifier.
Figure 3B:
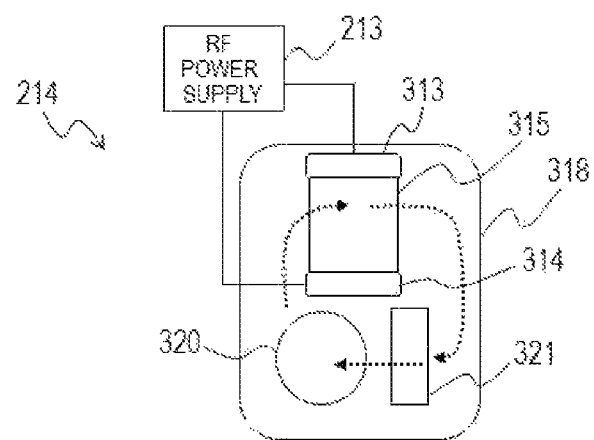
FIG. 3B is a cross-sectional diagram taken along the line IIIB-IIIB in FIG. 3A.

A triaxial cross flow laser apparatus may be used as an example of the optical amplifier 214. Hereinafter, the triaxial cross flow laser apparatus used as an optical amplifier is referred to as triaxial cross flow amplifier. Other types of laser apparatuses may be used as the optical amplifier 214. FIGS. 3A and 3B schematically illustrate a configuration example of the triaxial cross flow amplifier 214. FIG. 3A is a side elevation diagram of the triaxial cross flow amplifier 214. A part of the components are seen through. FIG. 3B is a cross-sectional diagram taken along the line IIIB-IIIB in FIG. 3A.

The triaxial cross flow amplifier 214 may include a laser chamber 318 for accommodating other components. The triaxial cross flow amplifier 214 may include a pair of electrodes 313 and 314, a pair of mirrors 316 and 317, a cross-flow fan 320, a motor 319, and a cooling unit 321. The pair of electrodes 313 and 314 may be connected with a PA power supply 213.

The motor 319 may rotate the cross-flow fan 320 to circulate the laser gas between the electrodes 313 and 314. The cooling unit 321 may cool down the laser gas. The PA power supply 213 may apply a voltage induced by a predetermined discharge current across the electrodes 313 and 314 to cause the laser gas to discharge electricity in the discharge region 315. The laser gas in the discharge region 315 may be excited to become amplification medium.

A laser beam that has entered the laser chamber 318 through an input window 311 may be reflected off the mirrors 316 and 317 and travel through the discharge region 315. The laser beam may be amplified in the discharge region 315. The amplified laser beam may go out from the output window 312.

Figure 4:
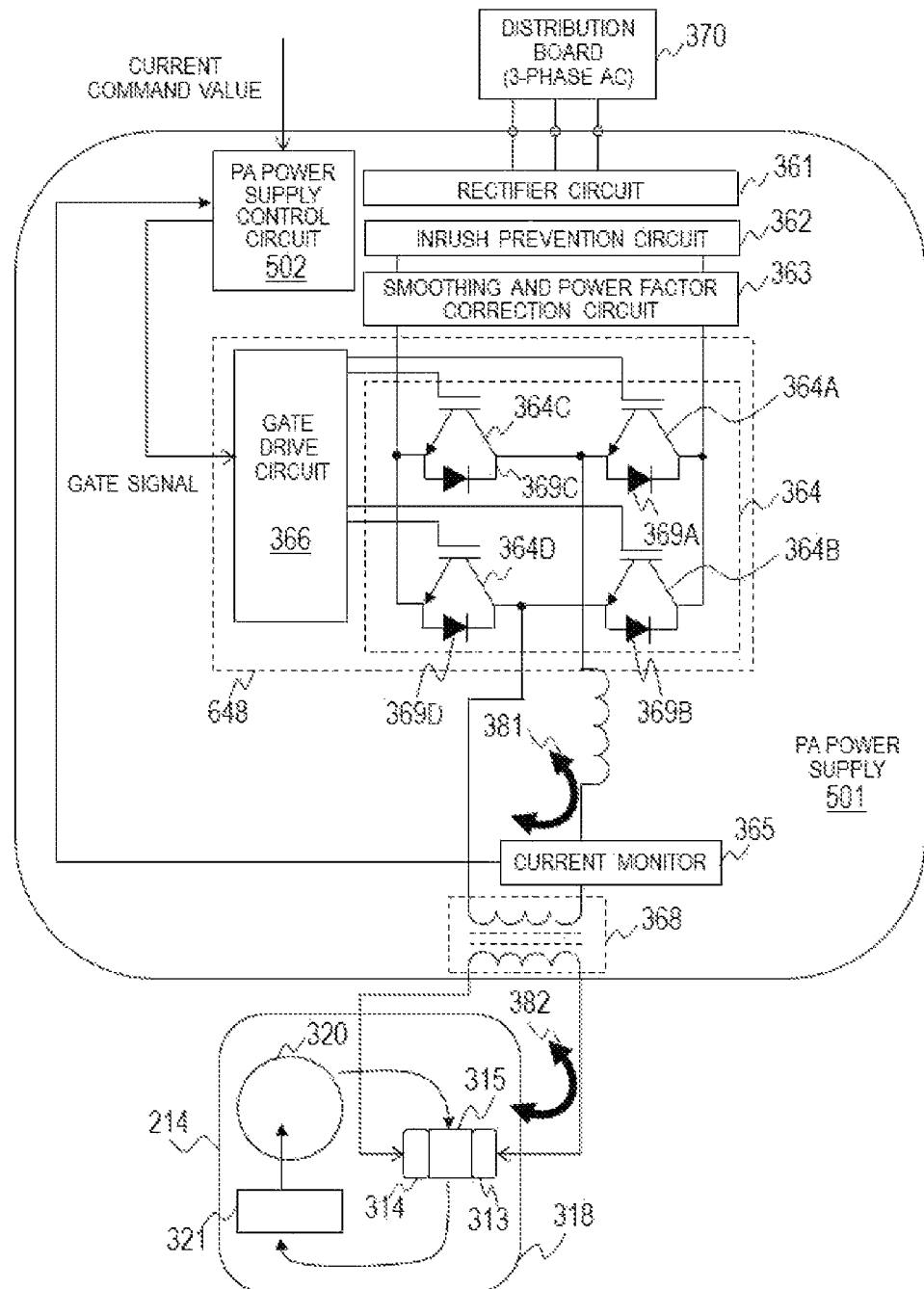
FIG. 4 schematically illustrates a configuration of a comparative example of a PA power supply.

4.3-2 Configuration and Operation of PA Power Supply of Comparative Example FIG. 4 schematically illustrates a configuration of a comparative example 501 of the PA power supply 213. The PA power supply 501 includes a PA power supply control circuit 502, a rectifier circuit 361, an inrush prevention circuit 362, a smoothing and power factor correction circuit 363, an inverter circuit 648, a current monitor 365, and a transformer 368.

The rectifier circuit 361 may be connected with a three-phase AC distribution board 370. The rectifier circuit 361, the inrush prevention circuit 362, the smoothing and power factor correction circuit 363, the inverter circuit 648, and the transformer 368 are connected in series in this order from the distribution board 370.

The PA power supply control circuit 502 may be connected with the current monitor 365 to be able to monitor the inverter current 381. The inverter circuit 648 may include a gate drive circuit 366 and switching elements 364. The gate drive circuit 366 may be connected with the PA power supply control circuit 502.

The switching elements 364 may include switching elements 364A to 364D. The gates of the switching elements 364A to 364B may be connected with the gate drive circuit 366. The switching elements 364A to 364D may be IGBTs as shown in FIG. 4 or another type of switching elements. Flyback diodes 369A to 369D may be connected in parallel with the switching elements 364A to 364D, respectively.

The switching elements 364A and 364D may be connected in series via the transformer 368 and the switching elements 364B and 364C may be connected in series via the transformer 368. The switching elements 364A and 364B may be connected in parallel and the switching elements 364C and 364D may be connected in parallel.

In the switching elements 364, the switching elements 364A and 364D may constitute a pair and the switching elements 364B and 364C may constitute a pair. The gate drive circuit 366 may control the both of the pairs to be OFF or only one of the pairs to be ON. The direction of the voltage applied to the transformer 368 when one of the switching element pairs is ON may be opposite to the direction of the voltage when the other switching element pair is ON. The flyback diodes 369A to 369D may transmit the current when the switching elements are OFF and the back current when the switching elements are ON. The switching elements 364 may be configured differently.

The PA power supply 501 may generate an inverter current 381 to supply the discharge current 382 to the optical amplifier 214 through the transformer 368. Specifically, the PA power supply control circuit 502 may receive a current command value from the laser controller 211. The current command value from the laser controller 211 may be a value specifying the current value of the discharge current 382, for example.

The PA power supply control circuit 502 may perform feedback control of the inverter current 381 based on the inverter current 381 monitored by the current monitor 365 to attain the discharge current 382 specified by the current command value.

The PA power supply control circuit 502 may send a gate signal to the gate drive circuit 366 based on the current command value and the monitored value of the inverter current 381. Upon receipt of the gate signal, the gate drive circuit 366 may turn ON or OFF each of the switching elements 364 in accordance with the received gate signal. The gate drive circuit 366 may be able to control the inverter current 381 by controlling the switching elements 364A to 364D.

4.4 Issues on PA Power Supply of Comparative Example

Figure 5:
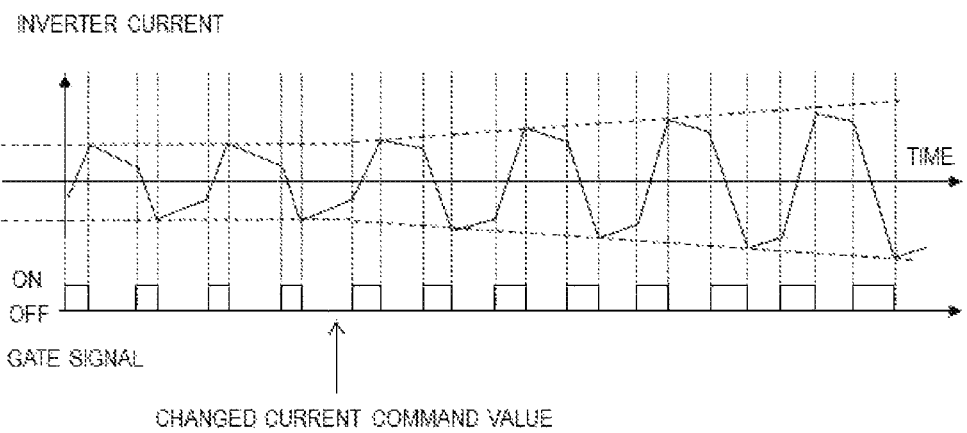
FIG. 5 illustrates temporal variation of a gate signal and an inverter current generated in the PA power supply of the comparative example.

FIG. 5 illustrates temporal variation of the gate signal and the inverter current 381 generated in the PA power supply

501 of the comparative example. The PA power supply control circuit 502 may control the inverter circuit 648 so that the inverter current 381 will exhibit the variation shown in FIG. 5. The discharge current 382 may exhibit variation in accordance with the variation of the inverter current 381.

The PA power supply control circuit 502 may periodically switch ON and OFF of the gate signal. The frequency of the gate signal may be the same or higher than the oscillation frequency of the master oscillator 212. In each period when the gate signal is ON, one of the switching element pairs may be ON and the other pair may be OFF. The gate signal in an ON period may be a pulse of the gate signal. The PA power supply control circuit 502 may alternate the switching element pairs in the ON state at each pulse.

The PA power supply control circuit 502 may control the inverter current 381 by PWM control of the inverter circuit 648. The PA power supply control circuit 502 may change the duty cycle of the pulse width of the gate signal to control the peak value (amplitude) of the inverter current 381. The pulse width may be the length of a period when the gate signal is ON.

The PA power supply control circuit 502 may gradually change the peak value of the inverter current 381 to the value corresponding to the current command value. The PA power supply control circuit 502 may hold information indicating the relations between current command values and peak values of the inverter current 381. Upon receipt of a changed current command value, the PA power supply control circuit 502 may gradually change the peak value of the inverter current 381 by feedback control with reference to the value of the current monitor 365. The pulse energy of the pulse laser beam of the optical amplifier 214 may gradually change toward the value corresponding to the current command value.

For example, the PA power supply control circuit 502 may gradually raise the peak value of the inverter current 381 in accordance with a new current command value as shown in FIG. 5. The PA power supply control circuit 502 may gradually increase the pulse width of the gate signal, that is, gradually increase the ON time of the gate signal through feedback control using the monitored value from the current monitor 365 to control the discharge current 382 so that the discharge current 382 will gradually get closer to the value corresponding to the current command value.

As described above, the output control for the optical amplifier 214 using feedback control may gradually change the pulse energy. Accordingly, this control may not be able to speedily control the pulse energy with the current command value corresponding to desired pulse energy.

However, for the laser processing machine required to exhibit highly precise stability in pulse energy, it may be demanded that the processing machine controller 221 controls the pulse energy pulse by pulse to keep the fluctuant pulse energy of the laser beam in high stability. The feedback control in the above-described comparative example may not satisfy this demand.

4.5 PA Power Supply of Present Embodiment 4.5-1 Configuration and Operation

Figure 6:
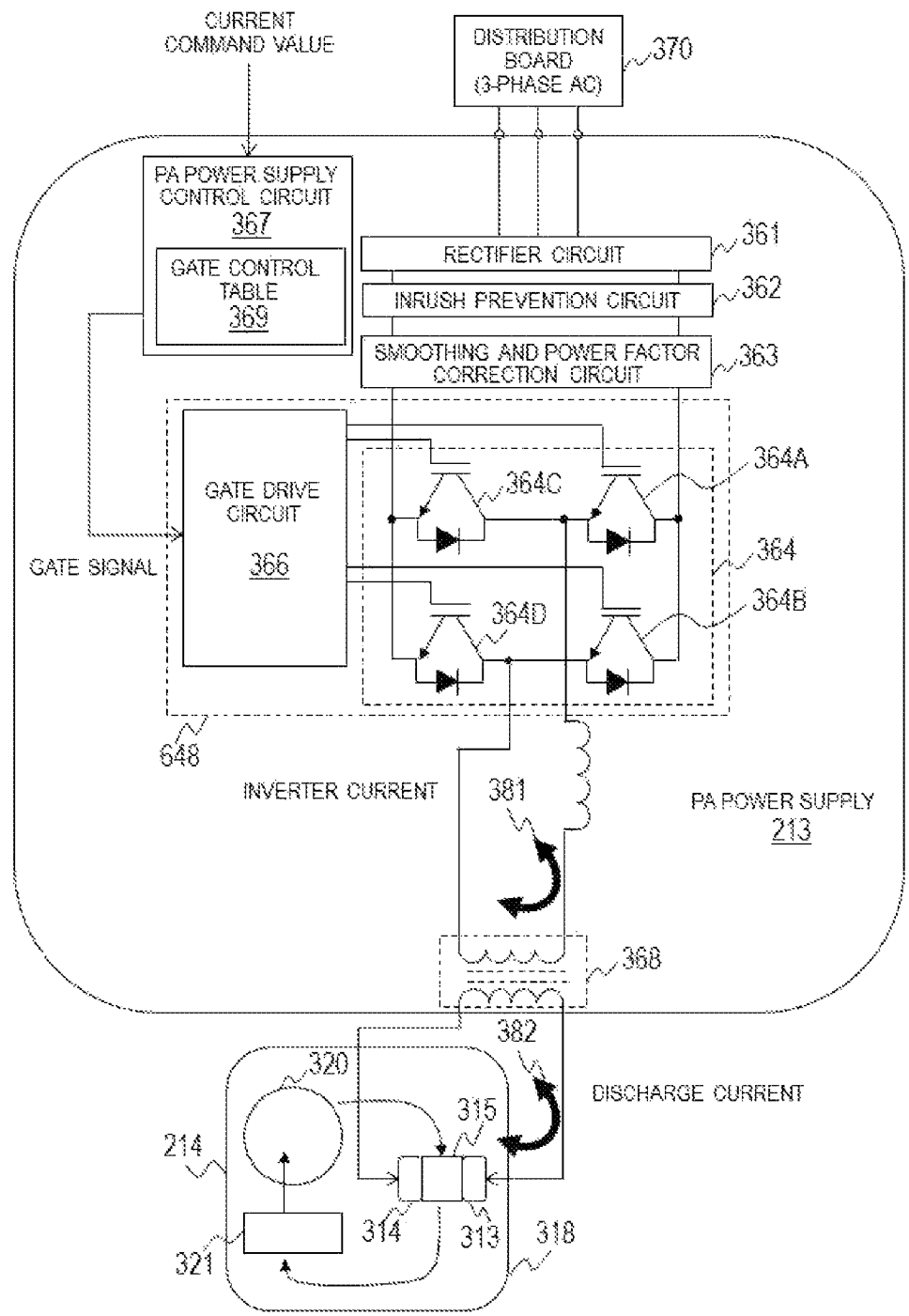
FIG. 6 schematically illustrates a configuration example of a PA power supply in Embodiment 1.

FIG. 6 schematically illustrates a configuration example of a PA power supply 213 of the present embodiment. Hereinafter, differences from the comparative example 501 described with reference to FIG. 4 will be mainly described. The PA power supply 213 may not need to include the current monitor 365. The PA power supply control circuit 367 may include a volatile or non-volatile storage device for storing a gate control table 369. The AC current generation circuit in the present disclosure may include an inverter circuit 648 and a transformer 368.

FIG. 7 illustrates a configuration example of the gate control table 369. The gate control table 369 may define the correspondence relation between the current command value IC and the ON-time length G of the gate signal. The ON-time length of the gate signal may be the pulse width of the gate signal. A duty cycle of the gate signal may be determined uniquely to an ON-time length of the gate signal.

Upon receipt of a current command value, the PA power supply control circuit 367 may determine an ON-time length of the gate signal corresponding to the current command value with reference to the gate control table 369. The PA power supply control circuit 367 may output a gate signal having the determined ON-time length to the gate drive circuit 366.

The PA power supply 213 may include a register for holding the current command value. Upon receipt of a new current command value, the PA power supply 213 may update the value stored in the register with the new current command value. The PA power supply 213 may determine the pulse width of each pulse of the gate signal based on the current command value stored in the register and the gate control table 369.

FIG. 8 schematically illustrates temporal variation of the gate signal from the PA power supply control circuit 367 and the inverter current 381 outputted in accordance with the gate signal. In response to input of a current command value, the PA power supply control circuit 367 sets a corresponding gate signal with reference to the table. For example, the current command value may specify a value for the inverter current 381 or a value for the discharge current 382.

For example, upon receipt of a current command value, the PA power supply control circuit 367 may change the ON-time length of the gate signal from the current length directly to the length corresponding to the current command value. For example, the PA power supply control circuit 367 may change the ON-time length to the length corresponding to the current command value for the next pulse of the gate signal after receipt of the current command value.

The gate drive circuit 366 may control the switching elements 364A to 364D in accordance with the gate signal received from the PA power supply control circuit 367. Controlling the switching elements 364A to 364D may instantly change the peak value of the inverter current 381 to the value corresponding to the current command value. Together with the change of the inverter current 381, the peak value of the discharge current 382 may instantly change to the value corresponding to the current command value.

The interface between the PA power supply control circuit 367 and the laser controller 211 may be configured with parallel I/O. This configuration may achieve high-speed transmission of the current command value from the laser controller 211 to the PA power supply control circuit 367. The current command value may be a numerical value transferrable by parallel I/O, for example. The current command value may be expressed in a 16-bit digital signal, for example.

The current command value may specify a value premised on PWM control of the inverter circuit 648 by the PA power supply control circuit 367. This configuration may allow the gate control table 369 to be omitted.

For example, the laser controller 211 may specify an ON-time length of the gate signal. The PA power supply control circuit 367 may change the ON-time length of the gate signal to the specified value without using the gate control table 369.

For example, the laser controller 211 may output a 16-bit digital signal specifying a duty cycle of the gate signal to the PA power supply control circuit 367. Specifying a duty cycle may correspond to specifying an ON-time length. The current command value may be expressed in a pulse signal for the PA power supply control circuit 367 specifying an ON-time length of the gate signal. The pulse width of the pulse signal from the laser controller 211 to the PA power supply control circuit 367 may be the same as the ON-time length of the gate signal.

The correspondences between the current command values and the gate signal in the gate control table 369 may be determined by experiment in advance. The PA power supply control circuit 367 may determine an ON-time length of the gate signal corresponding to a current command value not included in the gate control table 369 using a complementary calculation. For example, in the case where a current command value ICX between a current command value IC2 and a current command value IC3 is input (IC2<ICX<IC3), the PA power supply control circuit 367 may calculate the ON-time length GX of the gate signal corresponding to the current command value ICX using the following formula:

$GX=(G3-G2)/(IC3-IC2)*ICX$

The PA power supply control circuit 367 may use a function, instead of the gate control table 369, to determine the ON-time length of the gate signal corresponding to a given current command value. FIG. 9 illustrates an example of the relation between the current command value and the ON-time length of the gate signal. The PA power supply control circuit 367 may hold a function defining the relation shown in FIG. 9 in advance. The function may be determined by experiment in advance. Both of the gate control table 369 and the function may be control information defining the relation between the current command value and the ON-time length (duty cycle) of the gate signal.

5. Laser Controller

5.1 Current Control Table

Figures 10, 11:
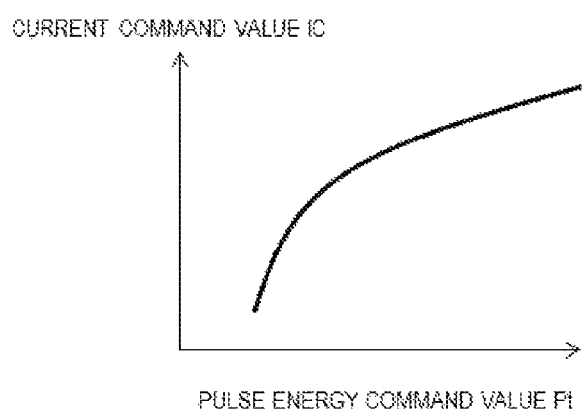
FIG. 10 illustrates a configuration example of a current control table to be consulted by a laser controller.
FIG. 11 illustrates a relation between pulse energy command value and current command value.

FIG. 10 illustrates a configuration example of a current control table 451 to be consulted by a laser controller 211. The laser controller 211 may include a volatile or non-volatile storage device for storing the current control table 451. The current control table 451 may define the correspondence relation between the pulse energy command value and the current command value. The correspondences between pulse energy command values and current command values may be determined by experiment in advance.

Upon receipt of a pulse energy command value from the processing machine controller 221, the laser controller 211 may determine a current command value corresponding to the received pulse energy command value with reference to the current control table 451.

The laser controller 211 may determine a current command value corresponding to a pulse energy command value not included in the current control table 451 using a complementary calculation. For example, in the case where a pulse energy command value PtY between a pulse energy command value Pt2 and a pulse energy command value Pt3 is input (Pt2<PtY<Pt3), the laser controller 211 may calculate the current command value ICY corresponding to the pulse energy command value PtY using the following formula:

$ICY=(IC3-IC2)/(Pt3-Pt2)*PtY$

The laser controller 211 may use a function, instead of the current control table 451, to determine the current command value corresponding to a given pulse energy command value. FIG. 11 illustrates a relation between the pulse energy command value and the current command value. The laser controller 211 may hold a function defining the relation shown in FIG. 11 in advance. The function may be determined by experiment in advance. Both of the current control table 451 and the function may be control information defining the relation between the pulse energy command value and the current command value.

5.2 Operation

Figure 12:
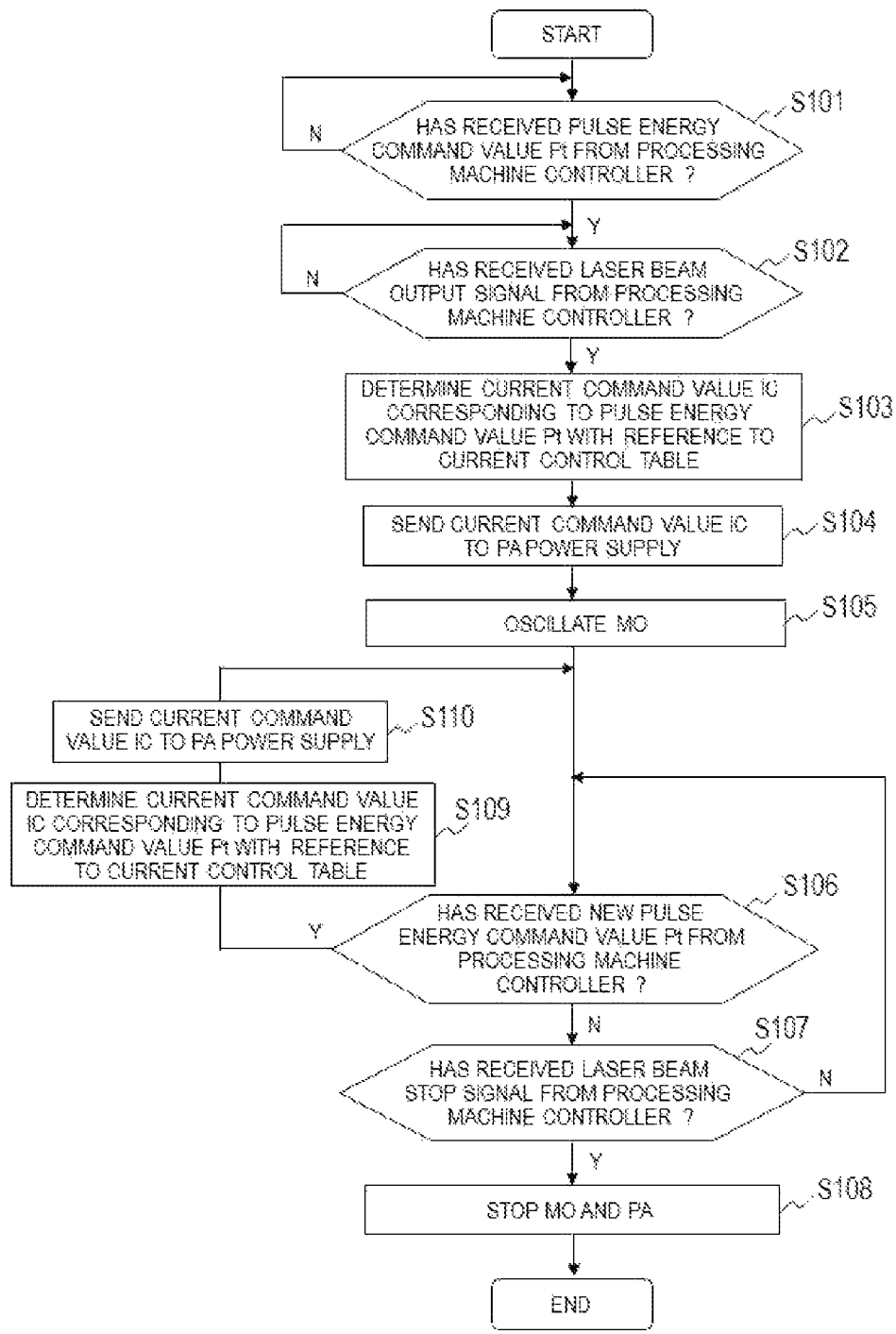
FIG. 12 is a flowchart of operation of a laser controller.

FIG. 12 is a flowchart of the operation of the laser controller 211. The laser controller 211 may stand by until receiving a pulse energy command value Pt from the processing machine controller 221 (S101: N). Upon receipt of a pulse energy command value Pt (S101: Y), the laser controller 211 may stand by until receiving a laser beam output signal from the processing machine controller 221 (S102: N).

Upon receipt of a pulse energy command value Pt (S101: Y) and a laser beam output signal (S102: Y) from the processing machine controller 221, the laser controller 211 may determine a current command value IC corresponding to the received pulse energy command value Pt with reference to the current control table 451 (S103).

The laser controller 211 may send the determined current command value IC to the PA power supply 213 (S104). The PA power supply 213 may output a discharge current 382 in accordance with the new current command value IC to the optical amplifier 214 to activate the optical amplifier 214.

The laser controller 211 may provide an MO exciting current to the master oscillator 212 to oscillate the master oscillator 212 at specified cyclic frequency, interval, and intensity to emit a laser beam (S105). The optical amplifier 214 may amplify the pulse laser beam from the master oscillator 212 to output the amplified pulse laser beam to the laser focusing/scanning optical system 222.

The laser controller 211 may stand by until receiving either a new pulse energy command value Pt or a laser beam stop signal (S106: N, S107: N). Upon receipt of a laser beam stop signal from the processing machine controller 221 (S107: Y), the laser controller 211 may stop the master oscillator 212 and the optical amplifier 214 (S108).

Upon receipt of a new pulse energy command value Pt from the processing machine controller 221 (S106: Y), the laser controller 211 may determine a current command value IC corresponding to the received new pulse energy command value Pt with reference to the current control table 451 (S109). The laser controller 211 may send the determined current command value IC to the PA power supply 213 (S110).

The cycle of the gate signal in the PA power supply 213 may be equal to or more than the cycle of the pulse laser beam to hit the work 231. The laser controller 211 may send a current command value IC to the PA power supply 213 in the cycle of the gate signal in the PA power supply 213. Unless receiving a new pulse energy command value Pt after the last pulse energy command value Pt, the laser controller 211 may send the same current command value IC as the last one to the PA power supply 213.

5.3 Effects

The laser controller 211 may instantly determine a current command value corresponding to a pulse energy command value Pt without using feedback control and send the current command value to the PA power supply 213. This configuration may achieve instant control of the discharge current 382 from the PA power supply 213 and further, speedy adjustment of the pulse energy of the outputted laser beam. For example, the pulse energy of the outputted laser beam may be adjusted pulse by pulse.

Embodiment 2

6. EUV Light Generation System 6.1 Configuration

Figures 13, 14:
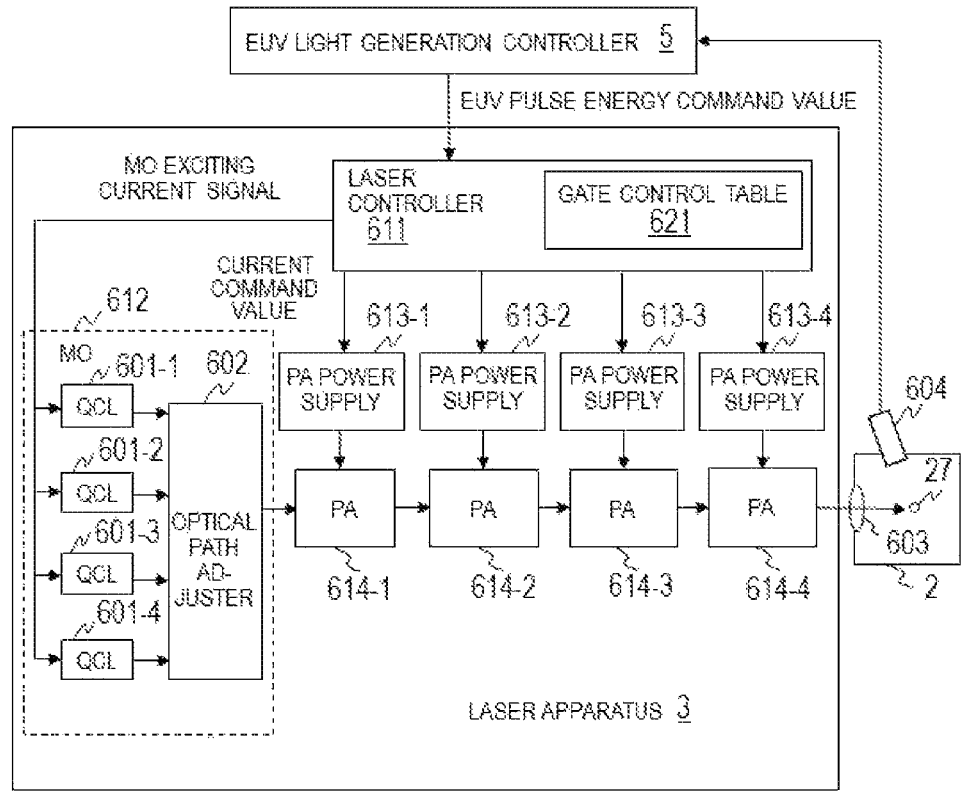
FIG. 13 schematically illustrates a configuration of an EUV light generation system in Embodiment 2.
FIG. 14 illustrates a configuration example of a gate control table.

FIG. 13 schematically illustrates a configuration of an EUV light generation system 11 in the present embodiment. In the chamber 2, a laser beam focusing optical system 603 for focusing a pulse laser beam onto a target 27 and an EUV sensor 604 for observing the energy of EUV light. The laser apparatus 3 may include a laser controller 611, a master oscillator (MO) 612, optical amplifiers (PAs) 614-1 to 614-4, and PA power supplies 613-1 to 613-4.

The master oscillator 612 may include a plurality of semiconductor lasers 601-1 to 601-4 and an optical path adjuster 602. The semiconductor lasers 601-1 to 601-4 may be quantum cascade lasers (QCLs) that output a laser beam including an amplifying range wavelength of the amplification medium including $CO_2$ gas.

Although FIG. 13 illustrates four quantum cascade lasers 601-1 to 601-4, the type and the number of lasers may be different ones. For example, the master oscillator 612 may be a $CO_2$ laser oscillator including a Q switch. The pulse laser beam outputted from the master oscillator 612 may be a linearly-polarized beam.

The optical amplifiers 614-1 to 614-4 may be disposed in series on the optical path of the pulse laser beam outputted from the master oscillator 612 and sequentially amplify the pulse laser beam outputted from the master oscillator 612. The optical amplifiers 614-1 to 614-4 may be the first-stage to the fourth-stage optical amplifiers. The optical amplifiers 614-1 to 614-4 may be laser amplifiers including $CO_2$ gas as laser medium.

The PA power supplies 613-1 to 613-4 may be connected with the optical amplifiers 614-1 to 614-4, respectively. Although FIG. 13 shows four optical amplifiers 614-1 to 614-4 and four PA power supplies 613-1 to 613-4 by way of example, the number of these components may be a different one.

Each of the optical amplifiers 614-1 to 614-4 may have the same configuration as the aforementioned optical amplifier 214. Each of the PA power supplies 613-1 to 613-4 may have the same configuration as the aforementioned PA power supply 213. The foregoing description of the optical amplifier 214 may apply to the optical amplifiers 614-1 to 614-4. The foregoing description of the PA power supply 213 may apply to the PA power supplies 613-1 to 613-4.

At least one optical isolator may be disposed any of between the master oscillator 612 and the optical amplifier 614-1, between two adjacent optical amplifiers, and downstream of the optical amplifier 614-4 on the optical path.

The laser controller 611 may be connected with the quantum cascade lasers 601-1 to 601-4 and the PA power supplies 613-1 to 613-4. The laser controller 611 may also be connected with the EUV light generation controller 5.

The laser controller 611 may include a gate control table 621. FIG. 14 illustrates a configuration example of the gate control table 621. The gate control table 621 may define the correspondence relation of the pulse energy command value from the EUV light generation controller 5 to the current command values for the optical amplifiers 614-1 to 614-4. The current command values for the optical amplifiers 614-1 to 614-4 may be sent by the laser controller 611 respectively to the PA power supplies 613-1 to 613-4, which are respectively connected with the optical amplifiers 614-1 to 614-4.

Instead of the gate control table 621, functions for the PA power supplies 613-1 to 613-4 may be defined. Both of the gate control table 621 and the functions may be control information for determining current command values. The point that both of the table and the functions for determining current command values are control information for determining current command values may apply to the other embodiments.

6.2 Operation

The laser controller 611 may supply an exciting current to the quantum cascade lasers 601-1 to 601-4 to oscillate them to output laser beams at specified cyclic frequency, interval, and intensity. The quantum cascade lasers 601-1 to 601-4 may output laser beams having different wavelengths. The optical path adjuster 602 may adjust the optical paths of the laser beams outputted from the quantum cascade lasers 601-1 to 601-4 so that the outputted laser beams will travel along the same path.

The EUV light generation controller 5 may send a pulse energy command value to the laser controller 611. The laser controller 611 may determine current command values for the PA power supplies 613-1 to 613-4 corresponding to the received pulse energy command value with reference to the gate control table 621. The laser controller 611 may send the determined current command values to the PA power supplies 613-1 to 613-4.

The PA power supplies 613-1 to 613-4 may supply discharge currents based on the current command values to the optical amplifiers 614-1 to 614-4, respectively. The PA power supplies 613-1 to 613-4 may generate discharge currents based on the current command values with the configuration and operation same as the aforementioned PA power supply 213. The optical amplifiers 614-1 to 614-4 may sequentially amplify the laser beam outputted from the master oscillator 612 and output the amplified laser beam.

The laser beam outputted from the laser apparatus 3 may hit a target 27 supplied into the chamber 2 to generate EUV light. The EUV light generation controller 5 may acquire a measured value of the EUV pulse energy from the EUV sensor 604. The EUV light generation controller 5 may send a pulse energy command value based on the acquired measured value to the laser controller 611 at each EUV pulse.

The pulse energy outputted from the optical amplifiers 614-1 to 614-4 may vary with variation in the temperature of the laser medium caused by variation in thermal load. Furthermore, the variation in the multi-stage optical amplifiers 614-1 to 614-4 is accumulated to become large variation in the energy of the pulse laser beam outputted from the laser apparatus 3.

To keep the pulse energy of the laser apparatus 3 that varies easily in high stability, pulse-by-pulse energy control in the optical amplifiers 614-1 to 614-4 may be demanded. For example, in the case where the cyclic frequency of outputting an EUV pulse is 50 to 100 kHz, control speed under 20 to 10 µs may be desired for the laser apparatus 3.

Each of the PA power supplies 613-1 to 613-4 may instantly change the ON-time length of the gate signal in accordance with the current command value like the aforementioned PA power supply 213. This operation may achieve high-speed control of the pulse energy outputted from the optical amplifiers 614-1 to 614-4. For example, each of the PA power supplies 613-1 to 613-4 may control the pulse width of the gate signal or the current command value at every cycle of the inverter current. The frequency of the inverter current may be the excitation frequency of the optical amplifiers 614-1 to 614-4; the excitation intensity may be changed at the excitation frequency of the optical amplifiers 614-1 to 614-4.

Assuming that the cyclic frequency to output an EUV pulse (EUV light generation frequency) is f and the excitation frequency of the optical amplifiers 614-1 to 614-4 is g, a relation of $f \leq g < 10f$ may be satisfied. Further, a relation of $f \leq g < 5f$ may be satisfied. Still further, a relation of $f=g$ may be satisfied. The output pulse frequency of the master oscillator 612 and the excitation frequency of the optical amplifiers 614-1 to 614-4 may have the same relation. The excitation frequency may be equal to or higher than the output pulse frequency.

For example, the excitation frequency of the optical amplifiers 614-1 to 614-4 may be several 100 kHz to several 10 MHz and the cyclic frequency of generating EUV light may be 50 to 100 kHz. The laser apparatus 3 may control the EUV light energy pulse by pulse in the EUV light generation system 11 by controlling the excitation intensity at the excitation frequency of the optical amplifiers 614-1 to 614-4.

Embodiment 3

7. Another Example of EUV Light Generation System

7.1 Configuration

Figure 15:
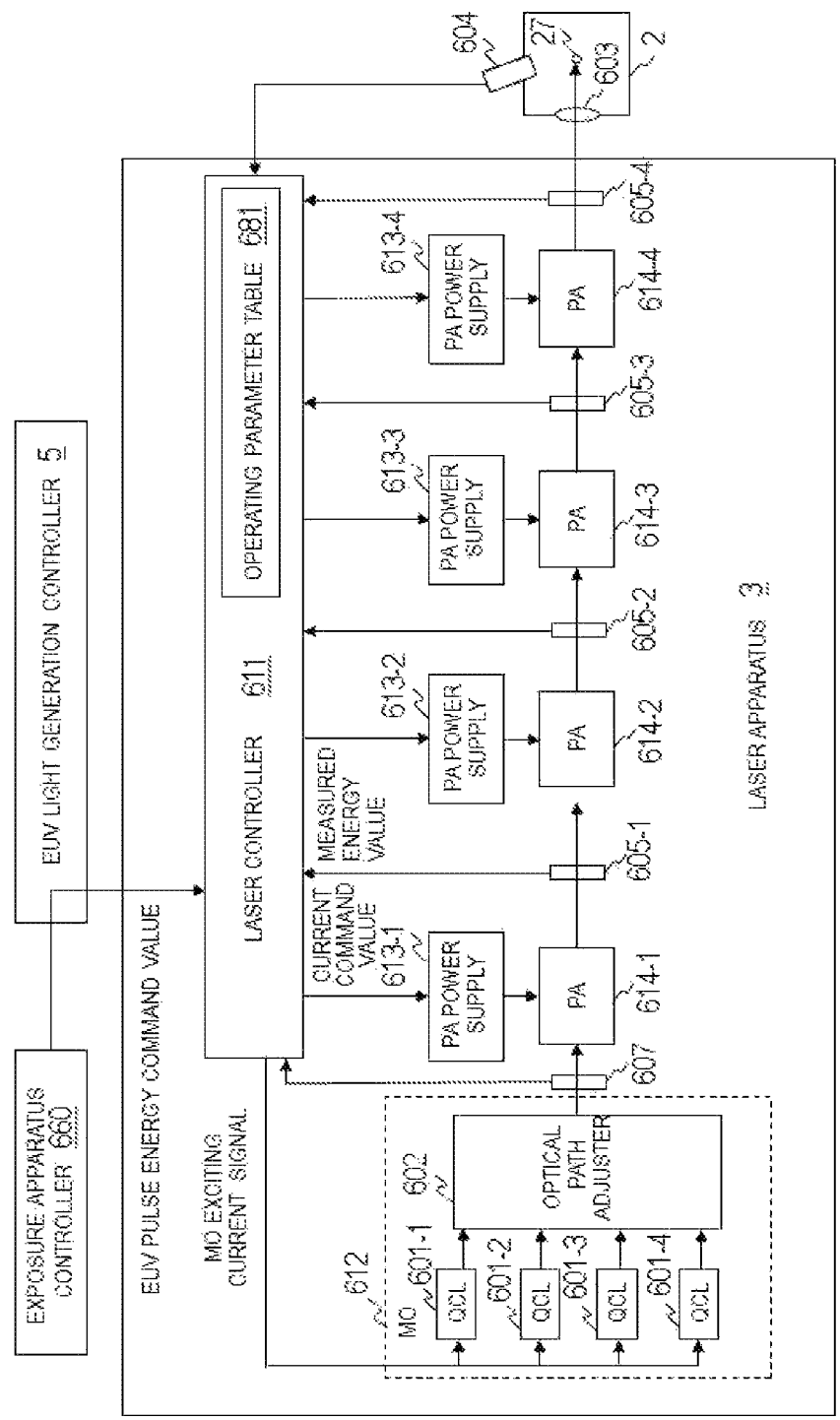
FIG. 15 illustrates a configuration example of an EUV light generation system in Embodiment 3.

FIG. 15 illustrates a configuration example of an EUV light generation system 11 in the present embodiment. Hereinafter, differences from the configuration illustrated in FIG. 13 will be mainly described. An MO energy detector 607 may be provided on the laser beam output side of the master oscillator 612. Furthermore, PA energy detectors 605-1 to 605-4 may be provided on the output side of the optical amplifiers 614-1 to 614-4, respectively.

The energy detectors 607 and 605-1 to 605-4 may be disposed on the optical path of the reflection from not-shown beam samplers provided on the optical path of the laser beam. The energy detectors 607 and 605-1 to 605-4 may be provided retractably from the optical path at a desired time.

The laser controller 611 may be connected with the energy detectors 607 and 605-1 to 605-4 in addition to the quantum cascade lasers 601-1 to 601-4 and the PA power supplies 613-1 to 613-4. The laser controller 611 may also be connected with an EUV sensor 604 provided in the chamber 2.

The laser controller 611 may include an operating parameter table 681. FIG. 16 illustrates a configuration example of the operating parameter table 681. The operating parameter table 681 may define the correspondence relation of the EUV pulse energy command value from the exposure apparatus controller 660 to the operating parameters for the quantum cascade lasers 601-1 to 601-4 and the PA power supplies 613-1 to 613-4.

The operating parameters managed by the operating parameter table 681 may include the exciting current for the master oscillator 612 and the current command values for the optical amplifiers 614-1 to 614-4. The operating parameter table 681 may further store target energy values for the master oscillator 612 and the optical amplifiers 614-1 to 614-4 for each of the EUV pulse energy command values.

The target energy values for the master oscillator 612 and the optical amplifiers 614-1 to 614-4 may be determined by experiment in advance. The target energy values for the master oscillator 612 and the optical amplifiers 614-1 to 614-4 may be fixed to the individual EUV pulse energy command values.

The exciting current for the master oscillator 612 may be determined to obtain the target energy for the master oscillator 612. The current command values for the optical amplifiers 614-1 to 614-4 may be determined to obtain the target energy for the optical amplifiers 614-1 to 614-4, respectively. The initial values of the exciting current for the master oscillator 612 and the current command values for the optical amplifiers 614-1 to 614-4 may be determined by experiment in advance.

As will be described later, the exciting current for the master oscillator 612 in the operating parameter table 681 may be updated depending on the target energy and the measured energy of the master oscillator 612. The current command values for the optical amplifiers 614-1 to 614-4 may be updated depending on the target energy values and measured energy values of the optical amplifiers 614-1 to 614-4, respectively. Instead of the operating parameter table 681, functions of the MO exciting current and the current command values for the optical amplifiers 614-1 to 614-4 may be used.

7.2 Operation

7.2-1 Overall Operation

The laser controller 611 may carry out adjustment oscillation before generating EUV light to correct the operating parameter table 681. The laser controller 611 may acquire measured values of the energy of the laser beam from the energy detectors 607 and 605-1 to 605-4 and correct the exciting current for the master oscillator 612 and the current command values for the optical amplifiers 614-1 to 614-4 based on the acquired detected energy values and the target energy values in the operating parameter table 681.

Figure 17:
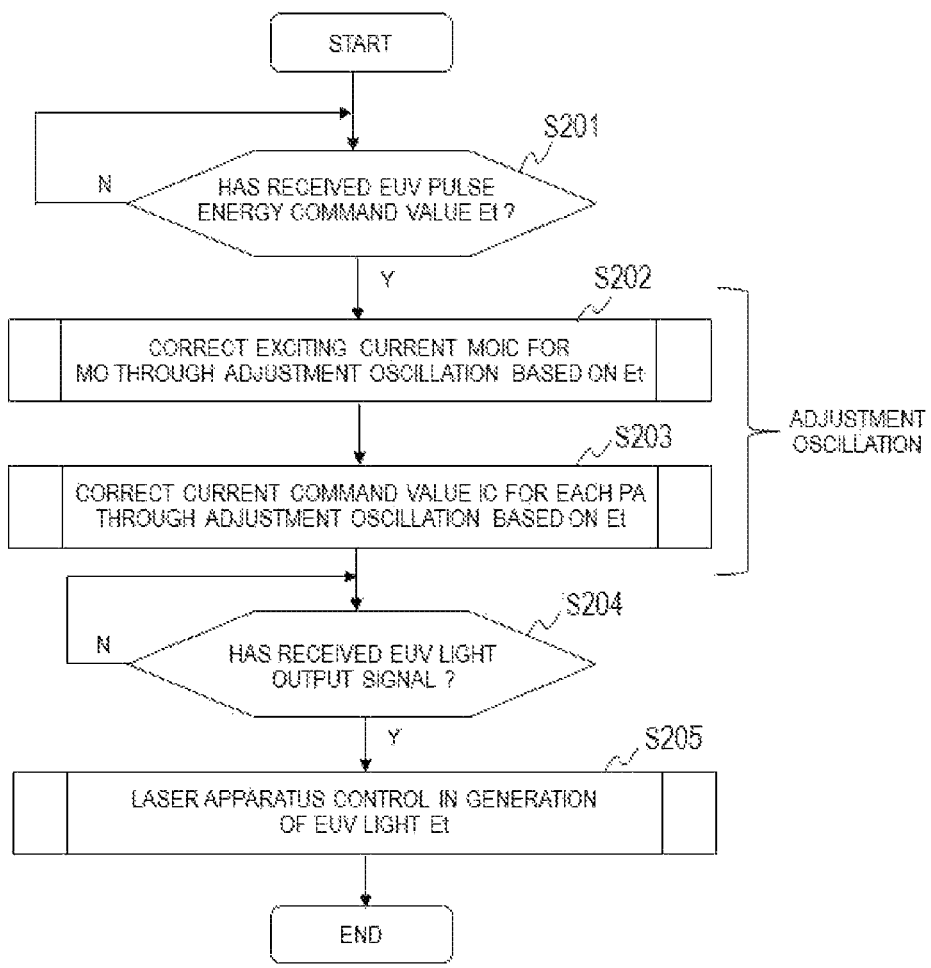
FIG. 17 is a flowchart of operation of a laser controller.

FIG. 17 is a flowchart of operation of the laser controller 611. The laser controller 611 may stand by until receiving an EUV pulse energy command value Et from the exposure apparatus controller 660 (S201: N). Upon receipt of an EUV pulse energy command value Et (S201: Y), the laser controller 611 may correct the exciting current MOIC for the master oscillator 612 in the operating parameter table 681 through adjustment oscillation based on the EUV pulse energy command value Et (S202).

The laser controller 611 may further correct the current command values for the optical amplifiers 614-1 to 614-4 in the operating parameter table 681 through adjustment oscillation based on the EUV pulse energy command value Et (S203).

The laser controller 611 may execute Steps S202 and S203 on a plurality of different EUV pulse energy command values Et. In the case where functions to calculate the exciting current MOIC and/or current command values IC are defined, the laser controller 611 may correct the functions.

After correcting the operating parameter table 681 through the adjustment oscillation, the laser controller 611 may stand by until receiving an EUV light output signal from the exposure apparatus controller 660 (S204: N). Upon receipt of the EUV light output signal from the exposure apparatus 660 (S204: Y), the laser controller 611 may start laser apparatus control in generation of EUV light (S205).

7.2-2 Correction of Operating Parameter Table

Figure 18:
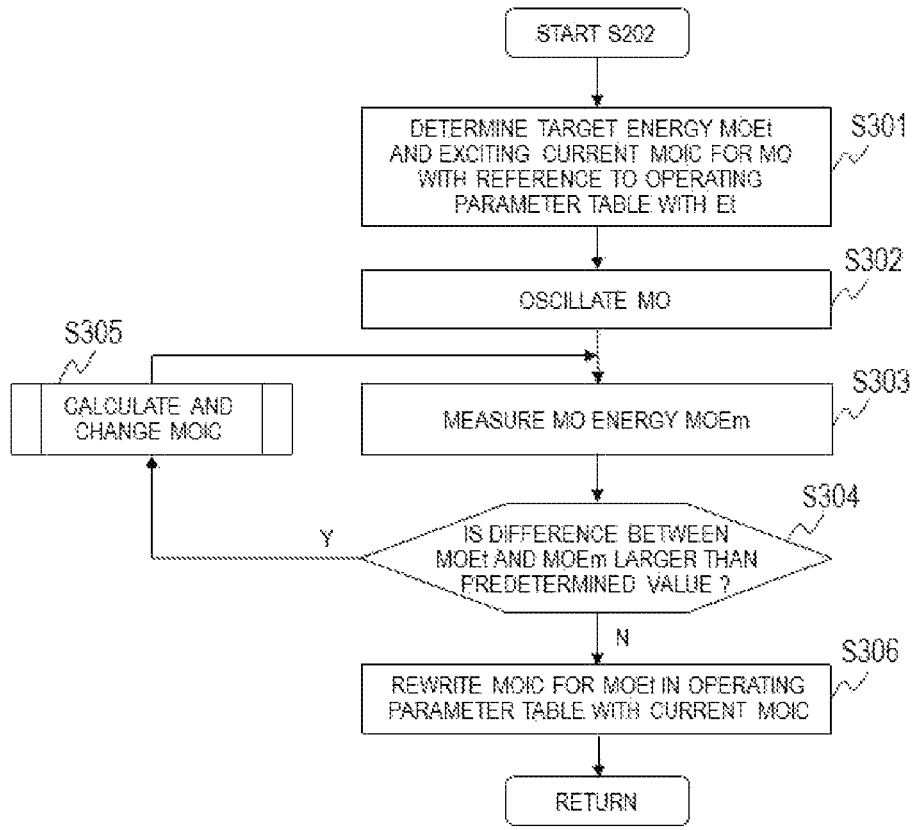
FIG. 18 is a detailed flowchart of correcting the exciting current for a master oscillator in the operating parameter table.

FIG. 18 is a detailed flowchart of correcting the exciting current for the master oscillator 612 in the operating parameter table 681 (S202). The laser controller 611 may determine the target energy MOEt and the exciting current MOIC for the master oscillator 612 with reference to the operating parameter table 681 with the EUV pulse energy command value Et (S301).

The laser controller 611 may oscillate the master oscillator 612 at the determined exciting current MOIC (S302). The laser controller 611 may acquire a measured energy value MOEm of the laser pulse from the MO energy detector 607 (S303).

The laser controller 611 may compare the difference between the measured energy value MOEm and the target energy value MOEt with a predetermined value (S304). If the difference is larger than the predetermined value (S304: Y), the laser controller 611 may calculate a new exciting current MOIC based on the latest exciting current MOIC and the difference and change the exciting current to be supplied to the master oscillator 612 to the newly calculated exciting current MOIC (S305).

Figure 19:
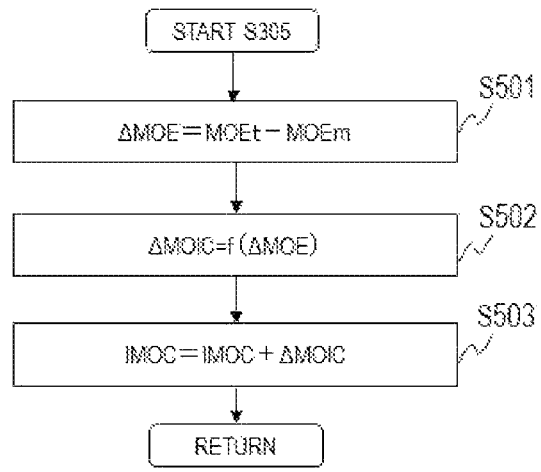
FIG. 19 is a detailed flowchart of calculating a new exciting current MOIC.

FIG. 19 is a detailed flowchart of calculating a new exciting current MOIC (S305). The laser controller 611 may calculate the difference ΔMOE between the measured energy value MOEm and the target energy value MOEt (S501). The laser controller 611 may substitute the difference ΔMOE into a predefined function f to calculate the compensation ΔMOIC in the exciting current MOIC (S502). The compensation ΔMOIC may be either positive or negative. The laser controller 611 may add the ΔMOIC to the latest exciting current MOIC to calculate a new exciting current MOIC (S503).

Returning to FIG. 18, if the difference at Step S304 is equal to or smaller than the predetermined value (S304: N), the laser controller 611 may rewrite the exciting current MOIC for the target energy MOEt in the operating parameter table 681 with the latest exciting current MOIC (S306). In this way, the exciting current MOIC may be corrected by feedback control that increases or reduces the MO exciting current for the next pulse in accordance with the latest detected MO energy value.

Figure 20:
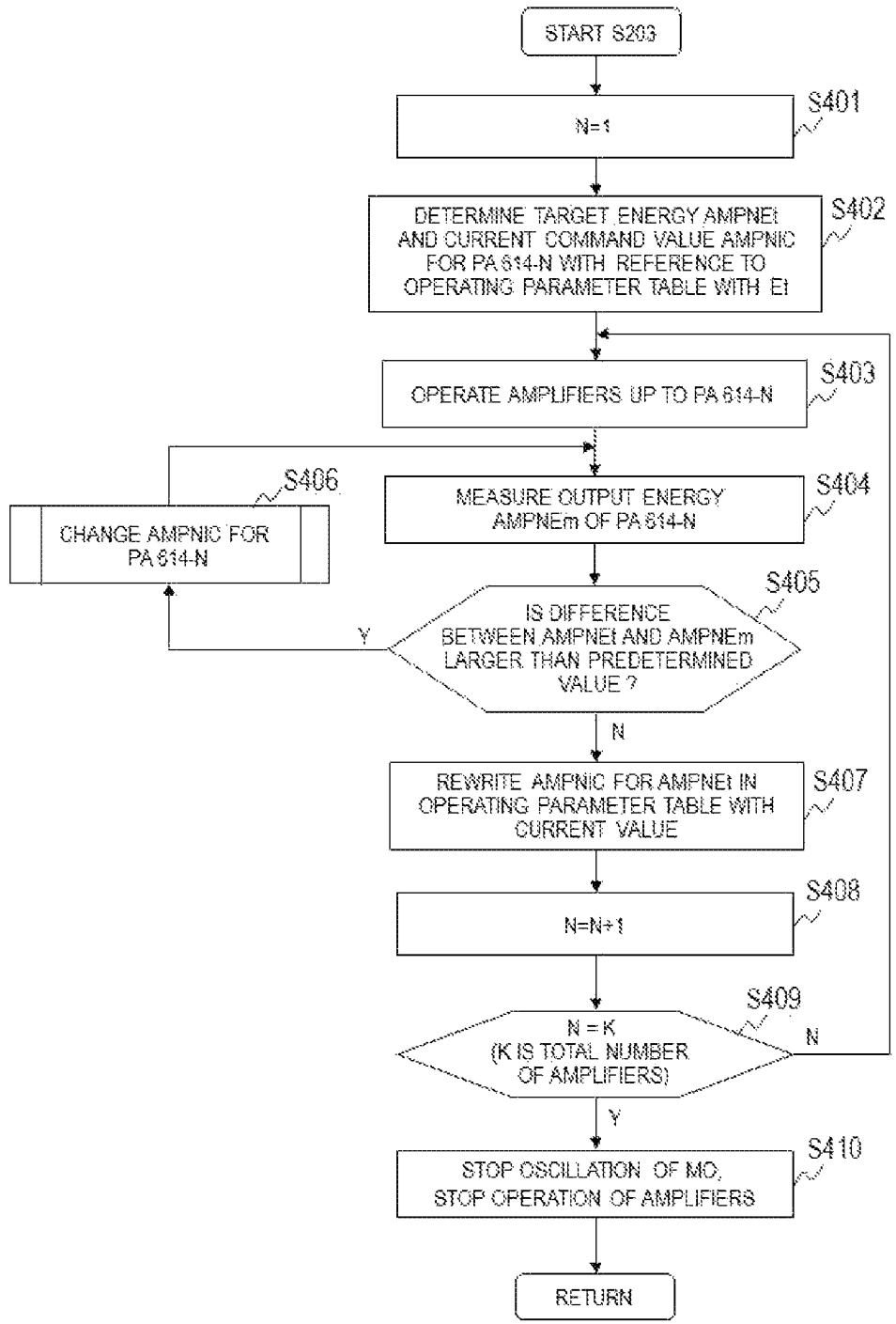
FIG. 20 is a detailed flowchart of correcting the current command values IC for optical amplifiers in the operating parameter table.

FIG. 20 is a detailed flowchart of correcting the current command values IC for the optical amplifiers 614-1 to 614-4 in the operating parameter table 681 (S203). The laser controller 611 may substitute 1 for the variable N (S401). The letter N in the variable names used in the flowchart of FIG. 20 is to be replaced by the value of the variable N. For example, in the case of N=2, the target energy AMPNEt is the target energy AMP2Et.

The laser controller 611 may determine the target energy AMPNEt and the current command value AMPNIC for the optical amplifier 614-N with reference to the operating parameter table 681 with the EUV pulse energy command value Et (S402).

The laser controller 611 may activate the optical amplifier 614-1 to the optical amplifier 614-N (S403). The laser controller 611 may send the current command values AMP11C to AMPNIC determined with reference to the operating parameter table 681 with the EUV pulse energy command value Et to the PA power supplies 613-1 to 613-N, respectively.

The laser controller 611 may measure the output energy AMPNEm of the optical amplifier 614-N with the PA energy detector 605-N (S404). The laser controller 611 may determine whether the difference between the target energy value AMPNEt and the measured energy value AMPNEm is larger than a predetermined value (S405).

If the difference between the target energy value AMPNEt and the measured energy value AMPNEm is larger than the predetermined value (S405: Y), the laser controller 611 may change the current command value AMPNIC for the optical amplifier 641-N (S406) and send the value to the PA power supply 613-N. The details of Step S406 will be described later.

If the difference between the target energy value AMPNEt and the measured energy value AMPNEm is equal to or smaller than the predetermined value (S405: N), the laser controller 611 may rewrite the current command value AMPNIC for the target energy value AMPNEt in the operating parameter table 681 with the latest value (S407).

The laser controller 611 may add one to the variable N (S408). The laser controller 611 may determine whether the variable N has reached the number K of the optical amplifiers (S409). In this example, K may be four. If the variable N has not reached the number K of the optical amplifiers (S409: N), the laser controller 611 may return to Step S403. If the variable N has reached the number K of the optical amplifiers (S409: Y), the laser controller 611 may stop the operation of the master oscillator 612 and the optical amplifiers 641-1 to 614-4 (S410).

As described above, the current command value of the optical amplifier 641-N may be changed by feedback control that increases or reduces the current command value for the next pulse in accordance with the latest measured energy value. The current command values for the optical amplifiers 641-1 to 641-4 may be corrected one by one from the upstream optical amplifier or the optical amplifier closest to the master oscillator 612 as described above.

Figure 21:
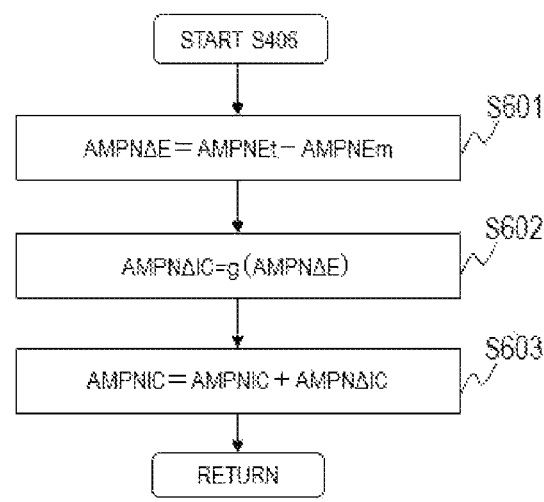
FIG. 21 is a detailed flowchart of changing the current command value IC for an optical amplifier.

FIG. 21 is a detailed flowchart of changing the AMPNIC for the optical amplifier 641-N(S406). The laser controller 611 may calculate the difference AMPNΔE between the target energy value AMPNEt and the measured energy value AMPNEm (S601). The laser controller 611 may substitute the calculated difference AMPNΔE into a predefined function g to calculate the compensation AMPNΔIC in the current command value (S602). The compensation AMPNΔIC in the current command value may be either positive or negative. The laser controller 611 may add the compensation AMPNΔIC to the latest current command value AMPNIC to calculate a new current command value AMPNIC (S603).

The operating parameter table 681 may be corrected to include appropriate values before generation of EUV light as described above. In the laser apparatus in Embodiment 1, the gate control table 369 may be corrected using the same method.

7.2-3 Laser Apparatus Control in Generation of EUV Light

Figure 22:
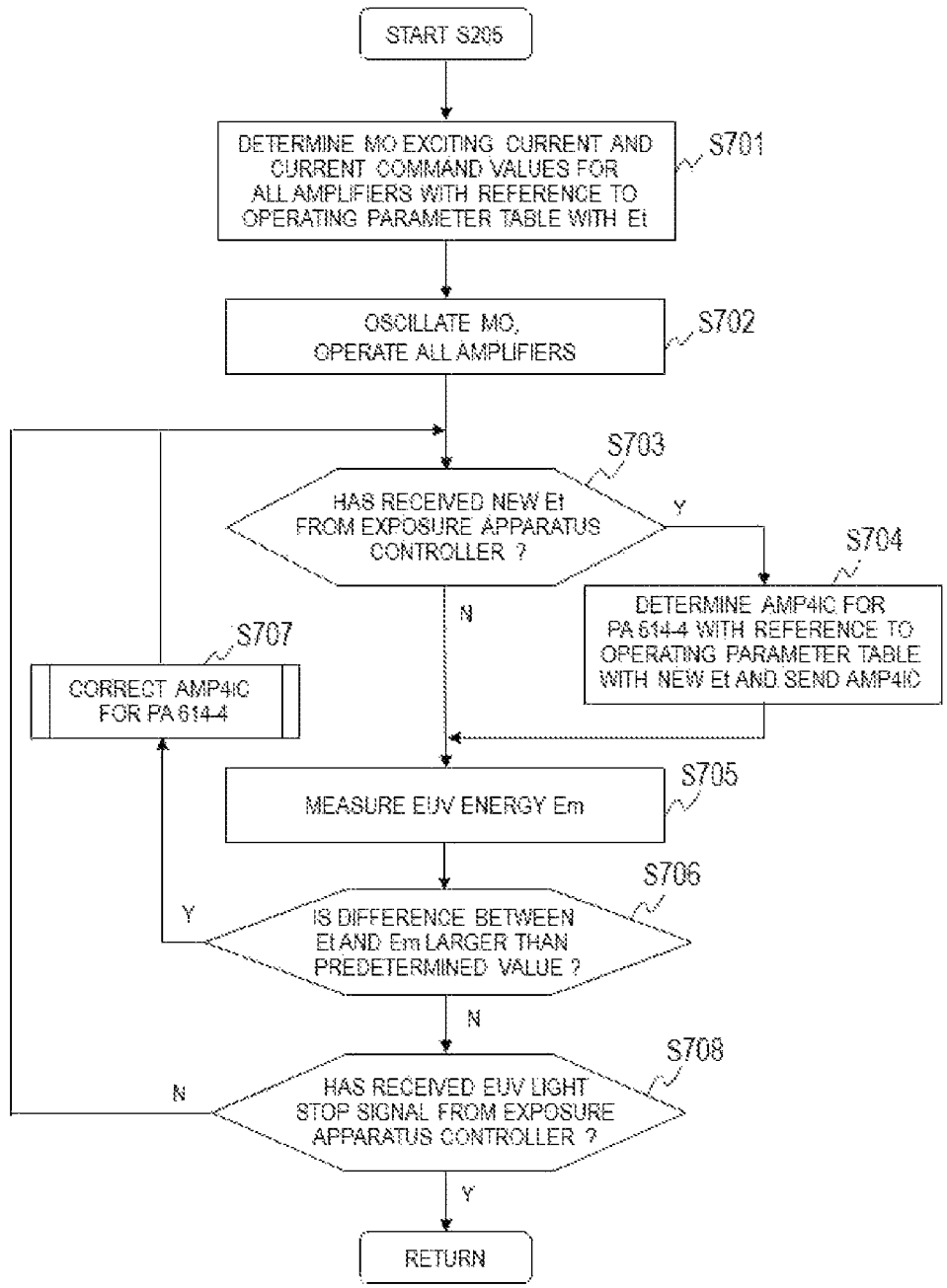
FIG. 22 is a detailed flowchart of laser apparatus control in generation of EUV light.

FIG. 22 is a detailed flowchart of laser apparatus control in generation of EUV light (S205). The laser controller 611 may determine the exciting current for the master oscillator 612 and the current command values for the optical amplifiers 614-1 to 614-4 with reference to the operating parameter table 681 with the EUV pulse energy command value Et (S701).

The laser controller 611 may oscillate the master oscillator 612 at the determined exciting current. The laser controller 611 may send the determined current command values to the PA power supplies 613-1 to 613-4 to operate the optical amplifiers 614-1 to 614-4 at the determined current command values (S702).

Subsequently, if the laser controller 611 has not received a new EUV pulse energy command value Et from the exposure apparatus controller 660 (S703: N), the laser controller 611 may measure the EUV pulse energy Em with the EUV sensor 604 (S705) and determine whether the difference between the measured EUV pulse energy Em and the EUV pulse energy command value Et is larger than a predetermined value (S706).

If the laser controller 611 has received a new EUV pulse energy command value Et from the exposure apparatus controller 660 (S703: Y), the laser controller 611 may determine the current command value for the final-stage optical amplifier 614-4 with reference to the operating parameter table 681 with the new EUV pulse energy command value Et and send the current command value to the PA power supply 613-4 (S704). Subsequently, the laser controller 611 may proceed to Step S705.

If the difference between the measured EUV pulse energy Em and the EUV pulse energy command value Et is equal to or smaller than the predetermined value (S706: N) and if the laser controller 661 has received an EUV light stop signal from the exposure apparatus controller 660 (S708: Y), the laser controller 611 may exit this process.

If the difference between the measured EUV pulse energy Em and the EUV pulse energy command value Et is equal to or smaller than the predetermined value (S706: N) and if the laser controller 660 has not received an EUV light stop signal from the exposure apparatus controller 660 (S708: N), the laser controller 611 may return to Step S703.

If the difference between the measured EUV pulse energy Em and the EUV pulse energy command value Et is larger than the predetermined value (S706: Y), the laser controller 611 may correct the current command value for the final-stage optical amplifier 614-4 (S707) and return to Step S703.

Figure 23:
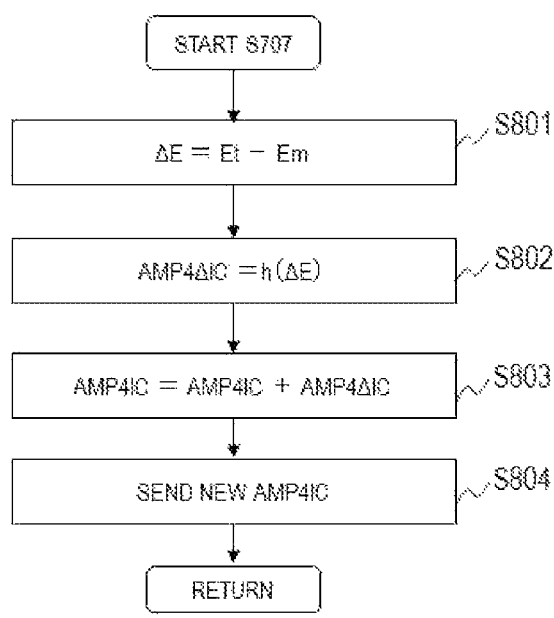
FIG. 23 is a detailed flowchart of correcting the current command value for an optical amplifier.

FIG. 23 is a detailed flowchart of correcting the current command value for the optical amplifier 614-4 (S707) in the flowchart of FIG. 22. The laser controller 611 may calculate the difference $\Delta E$ between the EUV pulse energy command value Et and the measured EUV pulse energy Em (S801). The laser controller 611 may substitute the calculated difference $\Delta E$ into a predefined function h to calculate the compensation AMP4$\Delta$IC in the current command value for the optical amplifier 614-4 (S802). The compensation AMP4$\Delta$IC may be either positive or negative.

The laser controller 611 may add the calculated compensation AMP4$\Delta$IC to the latest current command value AMP4IC for the optical amplifier 614-4 to calculate a new current command value AMP4IC for the optical amplifier 614-4 (S803). The laser controller 611 may send the new determined current command value AMP4IC to the PA power supply 613-4 of the optical amplifier 614-4. (S804).

As described above, the laser controller 611 may acquire a measured value of the EUV light energy from the EUV sensor 604 after adjustment oscillation and during generation of EUV light and control a part of the PA power supplies, for example the PA power supply 613-4, at each pulse of the laser beam.

As described above, the correction of the current command value for the optical amplifier 614-4 may be feedback control that increases or reduces the current command value for the next pulse based on the latest measured EUV light energy. If controlling the final-stage amplifier is not enough for the dynamic range capable of stabilizing the EUV light energy, the laser controller 611 may perform feedback control on another optical amplifier, for example the optical amplifier 614-3, together with the optical amplifier 614-4.

The above-described control of the optical amplifiers based on the output of the EUV sensor 604 may achieve stability in EUV light energy. Controlling only a part of the optical amplifiers including the final-stage amplifier may easily and effectively achieve the stability in EUV light energy.

The laser controller 611 may perform only a part of the steps in the flowchart of FIG. 17. Only the PA power supplies of the part of the optical amplifiers subject to correction of the current command values during generation of EUV light may have the same configuration as the aforementioned PA power supply 213.

Embodiment 4

8. Another Example of Laser Control 8.1 Burst Operation

The EUV light generation controller 5 may receive a burst signal from the exposure apparatus controller 660 in addition to an EUV pulse energy command value. The burst signal may be a signal for instructing the EUV light generation system 11 to generate EUV light in a specified period called a burst period.

The EUV light generation controller 5 may perform control to output EUV light to the exposure apparatus 6 in burst periods. The EUV light generation system 11 may output EUV light when the burst signal is ON. The period when the burst signal is ON is a burst period. When the burst signal is OFF, the EUV light generation system 11 may stop outputting EUV light. The period when the burst period is OFF is called an intermission period.

Figure 24A:
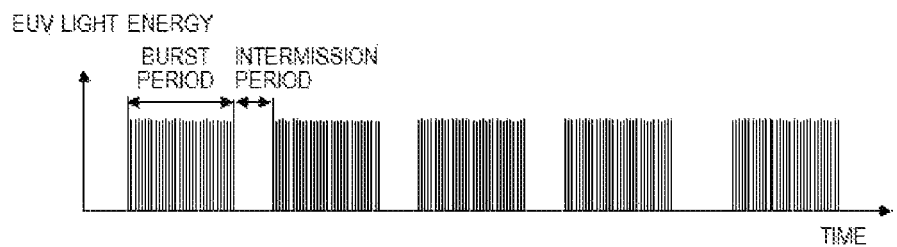
FIG. 24A illustrates temporal variation of the energy of EUV light in Embodiment 4.

FIG. 24A illustrates temporal variation of the energy of EUV light. The burst period and the intermission period may be repeated alternately. This operation of the EUV light generation system 11 is referred to as burst operation. The EUV light generation system 11 may output a predetermined number of pulses of EUV light at a predetermined cyclic frequency in a burst period. The EUV light generation controller 5 may control other devices to stabilize the EUV light energy in the burst period.

Figure 24B:
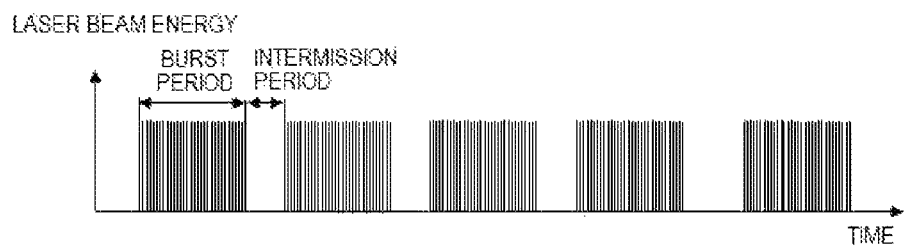
FIG. 24B illustrates temporal variation of the energy of a pulse laser beam to generate the EUV light in FIG. 24A.

FIG. 24B illustrates temporal variation of the energy of the pulse laser beam to generate the EUV light in FIG. 24A. The burst period and the intermission period may be repeated alternately. The energy of the pulse laser beam may exhibit temporal variation same as the temporal variation of the energy of EUV light. The laser controller 611 may receive a burst signal through the EUV light generation controller 5.

The laser controller 611 may control the laser apparatus 3 to output a pulse laser beam in the periods when the burst signal is ON. The laser controller 611 may control the laser apparatus 3 not to output a pulse laser beam in the periods when the burst signal is OFF. The laser apparatus 3 may output a predetermined number of pulses of laser beam at a predetermined cyclic frequency in each burst period. The laser controller 611 may control the laser apparatus 3 to stabilize the laser beam energy in the burst period.

8.2 Issues

Figure 24C:
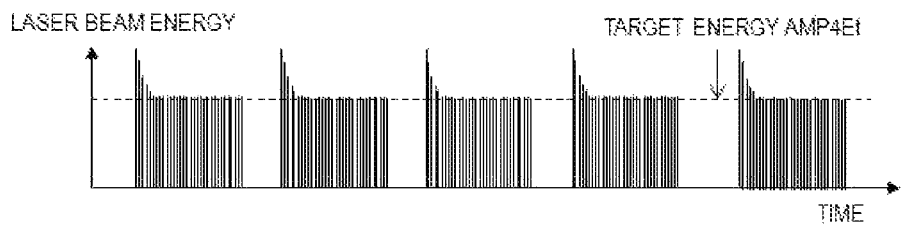
FIG. 24C illustrates an issue on the energy of the pulse laser beam in a burst period.

FIG. 24C illustrates an issue on the pulse laser beam energy in burst periods. The gain of the optical amplifiers may be high at the beginning of each burst period. Accordingly, during the first and subsequent several consecutive laser beam pulses after the burst signal has changed from OFF to ON, the laser beam pulse energy may tend to gradually decrease but to be high compared to the laser beam pulse energy in the subsequent pulses.

Figure 24D:
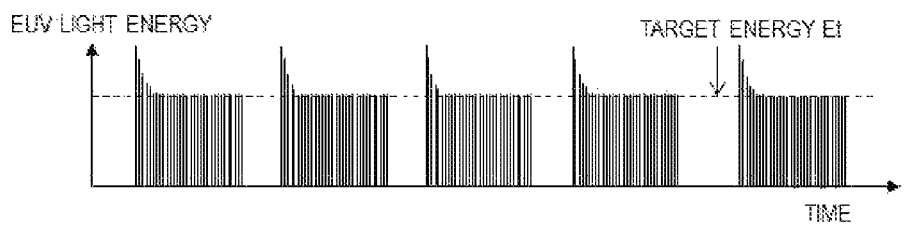
FIG. 24D illustrates temporal variation of the energy of EUV light corresponding to the pulse laser beam in FIG. 24C.

FIG. 24D illustrates temporal variation of the energy of EUV light corresponding to the pulse laser beam in FIG. 24C. Like the energy of the emitted pulse laser beam, the EUV light pulse energy may tend to gradually decrease during the first and subsequent several consecutive pulses in each burst but to be high compared to the EUV light pulse energy in the subsequent pulses.

To address this issue, the laser controller 611 may provide a lower current command value to the final-stage optical amplifier 614-4. However, if the following factors participate in the situation, the energy of the first and the subsequent several laser beam pulses may become too high, so that the laser beam energy may exceed the target output energy.

The first factor may be gas flow speed lowered by deterioration of the motor for rotating the cross-flow fan for circulating the laser gas in the optical amplifier. The second factor may be lowered temperature of the cooling water flowing in the cooling unit of the optical amplifier. The third factor may be increase in variation of the output of the master oscillator 612.

If the energy of the pulse laser beam input to the final-stage optical amplifier 614-4 is much higher than the target energy, controlling only the final-stage optical amplifier 614-4 may not be able to control the EUV light energy within a certain range from the EUV pulse energy command value (target energy) Et. Like this case, if the energy of the pulse laser beam is beyond the control dynamic range attained by only the final-stage optical amplifier 614-4, it may be difficult for the exposure apparatus 6 to control the exposure.

8.3 Configuration

Figure 25A:
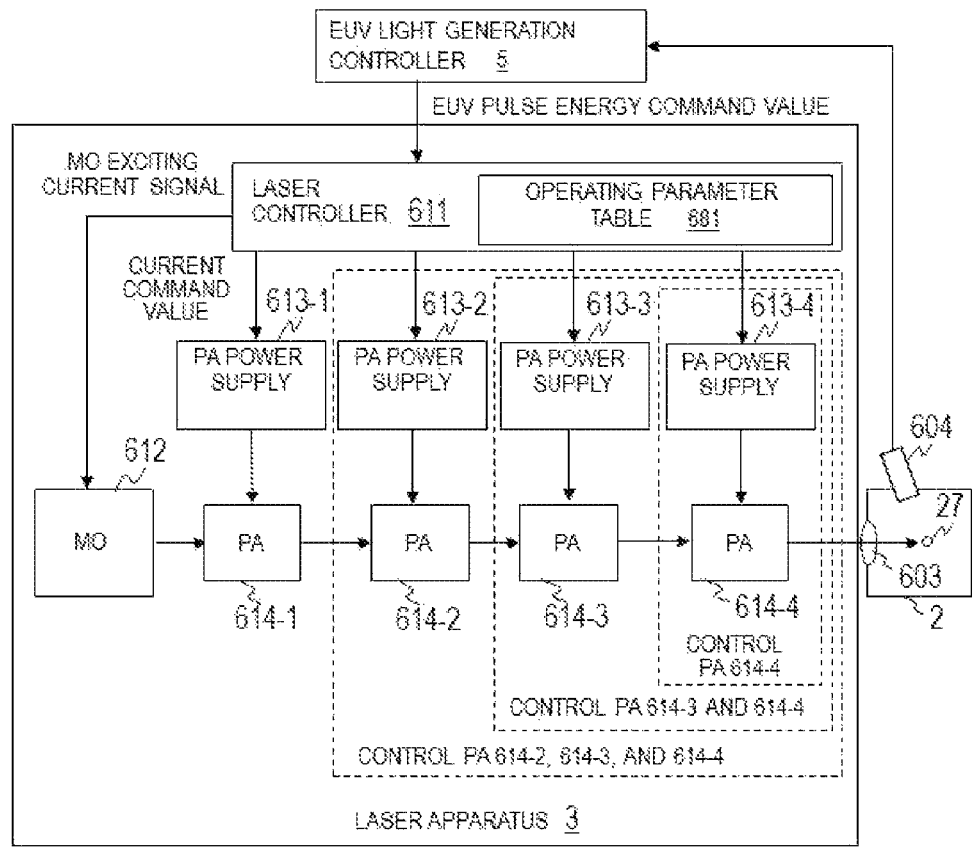
FIG. 25A illustrates control of optical amplifiers in the laser apparatus in Embodiment 4.

FIG. 25A illustrates control of optical amplifiers 614-1 to 614-4 in the laser apparatus 3 in the present embodiment. In generation of EUV light, the laser controller 611 may expand the control dynamic range of the laser apparatus 3 by feedback control of the optical amplifiers other than the final-stage optical amplifier 614-4 in addition to the final-stage optical amplifier 614-4. The feedback control may correct the current command values for the optical amplifiers based on the difference between the measured EUV pulse energy Em and the EUV pulse energy command value Et.

In the example illustrated in FIG. 25A, if the control dynamic range is sufficient only with the optical amplifier 614-4, the laser controller 611 may perform feedback control on only the optical amplifier 614-4. If the control dynamic range is insufficient only with the optical amplifier 614-4, the laser controller 611 may perform feedback control on the optical amplifiers 614-4 and 614-3.

If the control dynamic range is insufficient only with the optical amplifiers 614-4 and 614-3, the laser controller 611 may perform feedback control on the optical amplifiers 614-4, 614-3, and 614-2. The current command values for the upstream optical amplifiers that are not subject to the feedback control may be fixed, so that the outputs of the inverter circuits may be fixed.

As described above, the laser controller 611 may increase the number of optical amplifiers subject to feedback control from the downstream depending on the shortage of the control dynamic range. Detection of the shortage of the dynamic range may be based on the output value of the EUV sensor 604 or the output values of the energy detectors of the optical amplifiers.

Figure 25B:
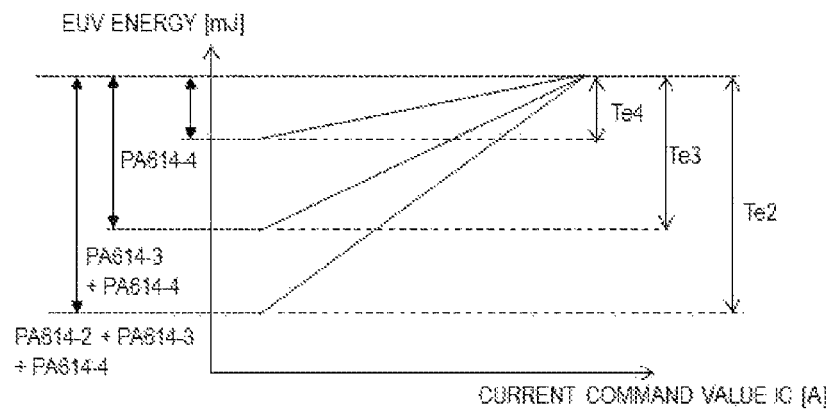
FIG. 25B illustrates a relation between the optical amplifier(s) subject to feedback control and the control dynamic range of EUV light energy.

FIG. 25B illustrates a relation between the optical amplifier(s) subject to feedback control and the control dynamic range of EUV light energy. As the number of optical amplifiers subject to feedback control increases, the control dynamic range of EUV light energy may expand.

Specifically, the control dynamic range Te3 of EUV light energy attained by the optical amplifiers 614-3 and 614-4 may be larger than the control dynamic range Te4 of EUV light energy attained by the optical amplifier 614-4. The control dynamic range Te2 of EUV light energy attained by the optical amplifiers 614-2, 614-3, and 614-4 may be larger than the control dynamic range Te3 of EUV light energy attained by the optical amplifiers 614-3 and 614-4.

8.4 Operation

Figure 26A:
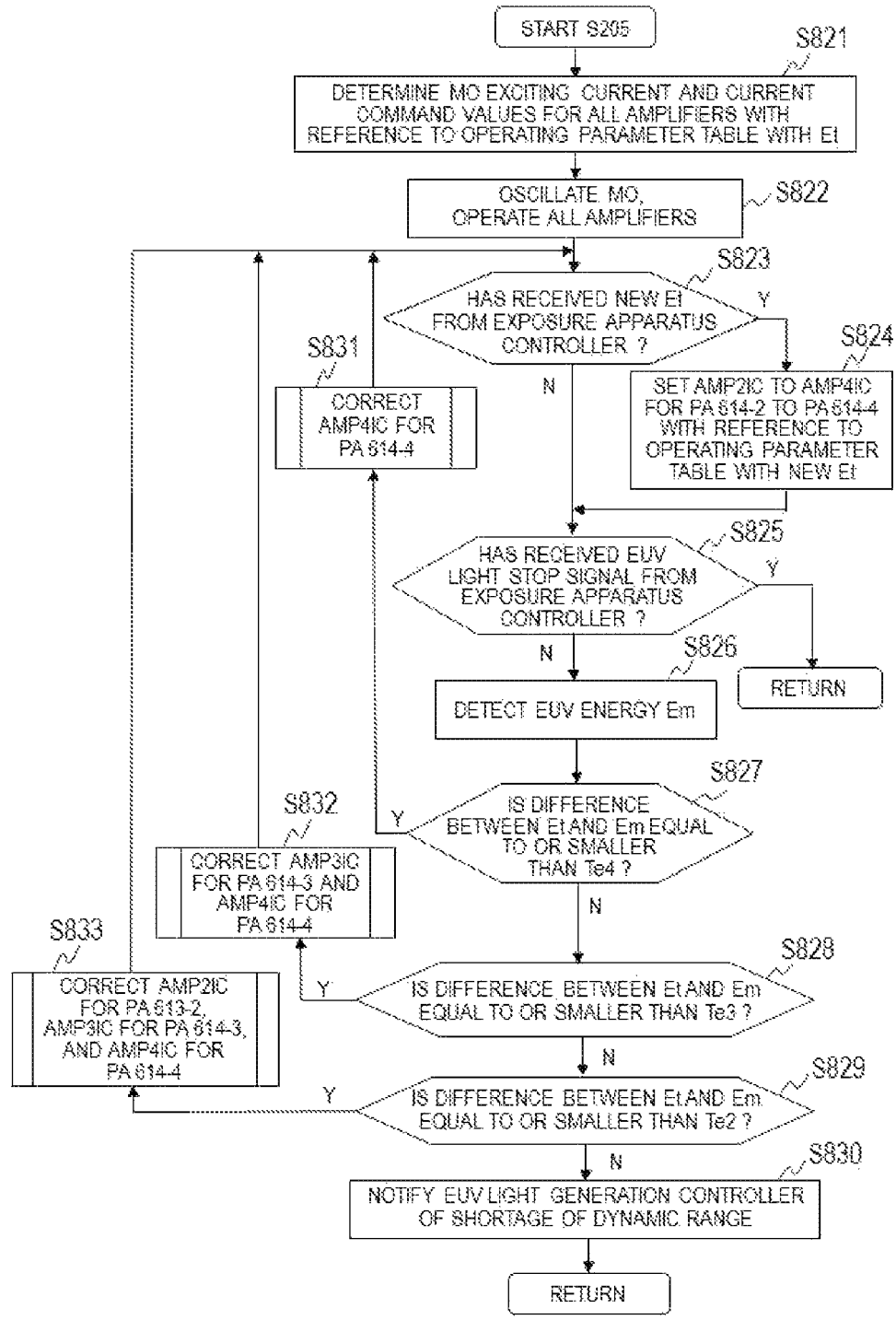
FIG. 26A is a flowchart of laser apparatus control in generation of EUV light in Embodiment 4.

FIG. 26A is a flowchart of laser apparatus control in generation of EUV light (S205) in the present embodiment. The laser controller 611 may determine a numerical value range including the difference between the measured EUV pulse energy Em and the EUV pulse energy command value Et and correct the current command values for the optical amplifiers associated with the numerical value range. For a numerical value range including greater numerical values, a larger number of optical amplifiers may be assigned.

First, the laser controller 611 may determine the exciting current for the master oscillator 612 and the current command values for the optical amplifiers 614-1 to 614-4 with reference to the operating parameter table 681 with the EUV pulse energy command value Et (S821).

The laser controller 611 may oscillate the master oscillator 612 at the determined exciting current. The laser controller 611 may send the determined current command values to the PA power supplies 613-1 to 613-4 to operate the optical amplifiers 614-1 to 614-4 at the determined current command values (S822).

If the laser controller 611 has not received a new EUV pulse energy command value Et from the exposure apparatus controller 660 (S823: N) and if the laser controller 611 has not received an EUV light stop signal from the exposure apparatus controller 660 (S825: N), the laser controller 611 may measure the EUV pulse energy Em with the EUV sensor 604 (S826) to determine whether the difference between the measured EUV pulse energy Em and the EUV pulse energy command value Et is equal to or smaller than a specified value Te4 (S827). The specified value Te4 may correspond to the control dynamic range of EUV light attained by the optical amplifier 614-4 and be determined by experiment.

If the laser controller 611 has received a new EUV pulse energy command value Et from the exposure apparatus controller 660 (S823: Y), the laser controller 611 may determine the current command values AMP2IC to AMP4IC with reference to the operating parameter table 681 with the new EUV pulse energy command value Et and send the current command values AMP2IC to AMP4IC to the PA power supplies 613-2 to 613-4 (S824).

Subsequently, the laser controller 611 may proceed to Step S825.

If the laser controller 611 has received an EUV light stop signal (S825: Y) from the exposure apparatus controller 660, the laser controller 611 may exit this process.

If the difference between the measured EUV pulse energy Em and the EUV pulse energy command value Et is larger than the specified value Te4 (S827: N), the laser controller 611 may determine whether the difference between the measured EUV pulse energy Em and the EUV pulse energy command value Et is equal to or smaller than a specified value Te3 (S828). The specified value Te3 may correspond to the control dynamic range of EUV light attained by the optical amplifiers 614-4 and 614-3, and be determined by experiment.

If the difference between the measured EUV pulse energy Em and the EUV pulse energy command value Et is larger than the specified value Te3 (S828: N), the laser controller 611 may determine whether the difference between the measured EUV pulse energy Em and the EUV pulse energy command value Et is equal to or smaller than a specified value Te2 (S829). The specified value Te2 may correspond to the control dynamic range of EUV light attained by the optical amplifiers 614-4, 614-3, and 614-2, and be determined by experiment.

If the difference between the measured EUV pulse energy Em and the EUV pulse energy command value Et is larger than the specified value Te2 (S829: N), the laser controller 611 may notify the EUV light generation controller 5 of shortage of the dynamic range (S830) and exit this process.

If the difference between the measured EUV pulse energy Em and the EUV pulse energy command value Et is equal to or smaller than the specified value Te4 (S827: Y), the laser controller 611 may correct only the current command value for the final-stage optical amplifier 614-4 (S831) and return to Step S823.

If the difference between the measured EUV pulse energy Em and the EUV pulse energy command value Et is larger than the specified value Te4 (S827: N) and equal to or smaller than the specified value Te3 (S828: Y), the laser controller 611 may correct the current command values for the final-stage optical amplifier 614-4 and the optical amplifier 614-3 (S832) and return to Step S823.

If the difference between the measured EUV pulse energy Em and the EUV pulse energy command value Et is larger than the specified value Te3 (S828: N) and equal to or smaller than the specified value Te2 (S829: Y), the laser controller 611 may correct the current command values for the final-stage optical amplifier 614-4 and the optical amplifiers 614-3 and 614-2 (S833) and return to Step S823.

Figure 26B:
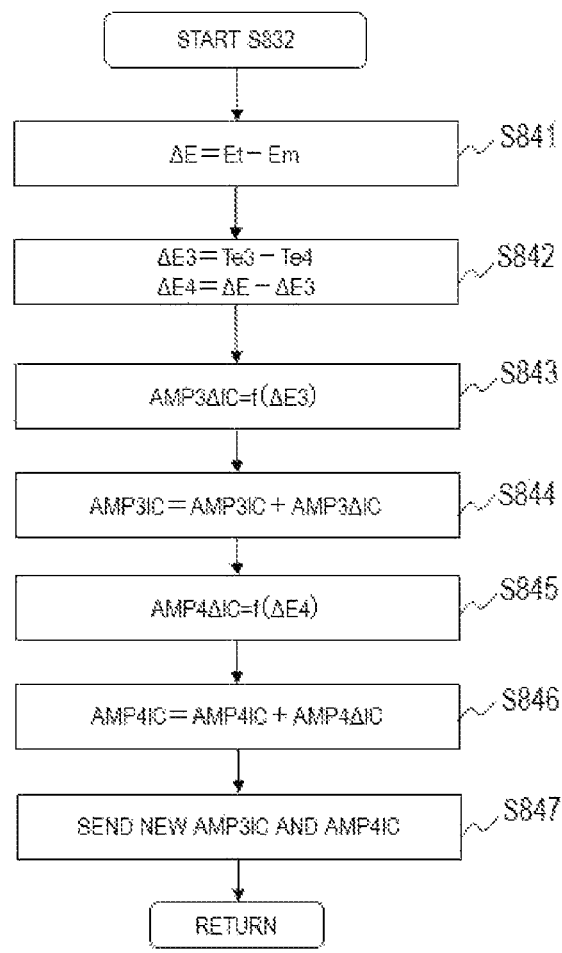
FIG. 26B is a detailed flowchart of correcting the current command values for optical amplifiers in the flowchart of FIG. 26A.

FIG. 26B is a detailed flowchart of correcting the current command values for the optical amplifiers 614-4 and 614-3 (S832) in the flowchart of FIG. 26A. For the correcting of the current command value for only the optical amplifier 614-4 (S831), the flowchart of FIG. 23 may be applicable.

In FIG. 26B, the laser controller 611 may calculate the difference $\Delta E$ between the EUV pulse energy command value Et and the measured EUV pulse energy Em (S841). The laser controller 611 may calculate the difference $\Delta E3$ between the specified value Te3 and the specified value Te4 and the difference $\Delta E4$ between the difference $\Delta E$ and the difference $\Delta E3$ (S842).

The laser controller 611 may substitute the calculated difference $\Delta E3$ into a predefined function f to calculate the compensation AMP3$\Delta$IC in the current command value for the optical amplifier 614-3 (S843). The difference $\Delta E3$ may be a fixed value independent from the difference $\Delta E$ between the EUV pulse energy command value Et and the measured EUV pulse energy Em and the compensation AMP3$\Delta$IC may also be a fixed value independent from the difference $\Delta E$. The laser controller 611 may add the compensation AMP3$\Delta$IC to the latest current command value AMP3IC for the optical amplifier 614-3 to calculate a new current command value AMP3IC for the optical amplifier 614-3 (S844).

The laser controller 611 may substitute the calculated difference $\Delta E4$ into the predefined function f to calculate the compensation AMP4$\Delta$IC in the current command value for the optical amplifier 614-4 (S845). The laser controller 611 may add the compensation AMP4$\Delta$IC to the latest current command value AMP4IC for the optical amplifier 614-4 to calculate a new current command value AMP4IC for the optical amplifier 614-4 (S846).

The laser controller 611 may send the newly determined current command values AMP3IC and AMP4IC to the PA power supply 613-3 of the optical amplifier 614-3 and the PA power supply 613-4 of the optical amplifier 614-4, respectively (S847).

Figure 26C:
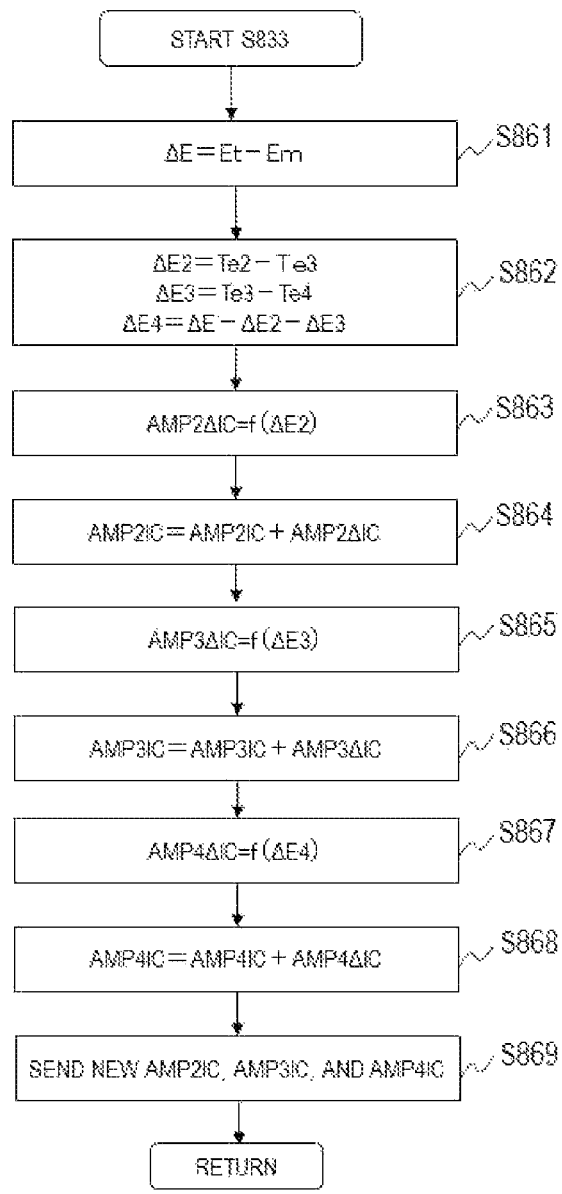
FIG. 26C is a detailed flowchart of correcting the current command values for optical amplifiers in the flowchart of FIG. 26A.

FIG. 26C is a detailed flowchart of correcting the current command values for the optical amplifiers 614-4, 614-3, and 614-2 (S833) in the flowchart of FIG. 26A. In FIG. 26C, the laser controller 611 may calculate the difference $\Delta E$ between the EUV pulse energy command value Et and the measured EUV pulse energy Em (S861).

The laser controller 611 may calculate the difference $\Delta E2$ between the specified value Te3 and the specified value Te2, the difference $\Delta E3$ between the specified value Te3 and the specified value Te4, and a difference $\Delta E4$ (S862). The difference $\Delta E4$ may be the difference between the difference $\Delta E$ and the sum of the differences $\Delta E2$ and $\Delta E3$.

The laser controller 611 may substitute the calculated difference $\Delta E2$ into the predefined function f to calculate the compensation AMP2$\Delta$IC in the current command value for the optical amplifier 614-2 (S863). The difference $\Delta E2$ may be a fixed value independent from the difference $\Delta E$ between the EUV pulse energy command value Et and the measured EUV pulse energy Em and the compensation AMP2$\Delta$IC may also be a fixed value independent from the difference $\Delta E$. The laser controller 611 may add the compensation AMP2$\Delta$IC to the latest current command value AMP2IC for the optical amplifier 614-2 to calculate a new current command value AMP2IC for the optical amplifier 614-2 (S864).

The laser controller 611 may substitute the calculated difference $\Delta E3$ into the predefined function f to calculate the compensation AMP3$\Delta$IC in the current command value for the optical amplifier 614-3 (S865). The laser controller 611 may add the compensation AMP3$\Delta$IC to the latest current command value AMP3IC for the optical amplifier 614-3 to calculate a new current command value AMP3IC for the optical amplifier 614-3 (S866).

The laser controller 611 may substitute the calculated difference $\Delta E4$ into the predefined function f to calculate the compensation AMP4$\Delta$IC in the current command value for the optical amplifier 614-4 (S867). The laser controller 611 may add the compensation AMP4$\Delta$IC to the latest current command value AMP4IC for the optical amplifier 614-4 to calculate a new current command value AMP4IC for the optical amplifier 614-4 (S868).

The laser controller 611 may send the newly determined current command values AMP2IC, AMP3IC, and AMP4IC to the PA power supply 613-2 of the optical amplifier 614-2, the PA power supply 613-3 of the optical amplifier 614-3, and the PA power supply 613-4 of the optical amplifier 614-4,

8.5 Effects

The present embodiment may keep the EUV light energy within a desired range by changing the control range of the EUV light energy, which may be achieved by changing the number of optical amplifiers subject to correction of current command values depending on the difference between the EUV pulse energy command value and the measured EUV pulse energy. Increasing the number of optical amplifiers subject to feedback control one by one from the final-stage optical amplifier toward the upstream may enable more accurate control of the energy of the pulse laser beam. Changing the compensation in the current command value for the final-stage optical amplifier depending on the difference between the EUV pulse energy command value and the measured EUV pulse energy and fixing the compensations in the current command values for the other optical amplifiers may enable efficient control of the energy of the pulse laser beam.

The number of optical amplifiers that are controllable by feedback control and other than the final-stage optical amplifier may depend on the design. The number may be one or more than two. The positions of the optical amplifiers controllable by feedback control other than the final-stage optical amplifier do not need to be immediately before the final-stage optical amplifier. The order of adding an optical amplifier does not need to be from the downstream side. The master oscillator may also be subject to feedback control.

Embodiment 5

9. Another Example of Laser Control

9.1 Overview

Figure 27:
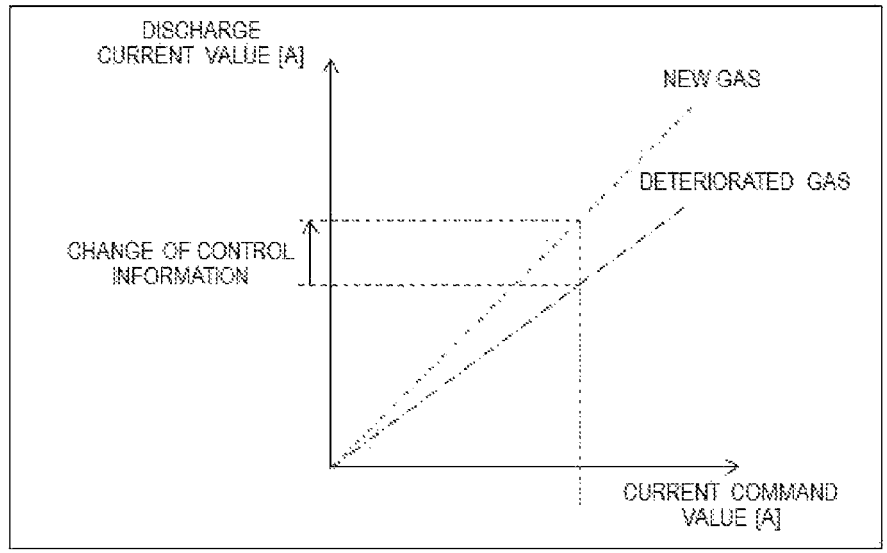
FIG. 27 illustrates relations between the current command value and the discharge current value in deteriorated laser gas and undeteriorated new laser gas in an optical amplifier in Embodiment 5.

FIG. 27 illustrates relations between the current command value and the discharge current value in deteriorated laser gas and undeteriorated new laser gas in an optical amplifier. The laser gas in an optical amplifier may deteriorate because of passage of time, increase in number of times of discharging, occurrence of improper discharge, and other causes. Typically, the gain of an optical amplifier may decrease when the optical amplifier uses deteriorated laser gas in amplification. Furthermore, the discharge current value may be low in the deteriorated laser gas compared to the current command value. It may be presumed that this is because the electric load of the laser gas varies as the laser gas deteriorates.

The laser apparatus in the present embodiment may detect deterioration of the gas in the optical amplifiers and rewrite the control information indicating the relation between the pulse energy command value and the current command value. As illustrated in FIG. 27, the deviation of the discharge current value from the current command value caused by deterioration of the gas may be compensated by rewriting the control information.

The deterioration of the gas may be detected based on the difference between the current command value and the discharge current value or the laser power lowered at the same current command value. There is a known optical amplifier that automatically replaces the gas at predetermined intervals or at the startup. The present embodiment does not need to be applied to such an optical amplifier.

9.2 Configuration

Figure 28:
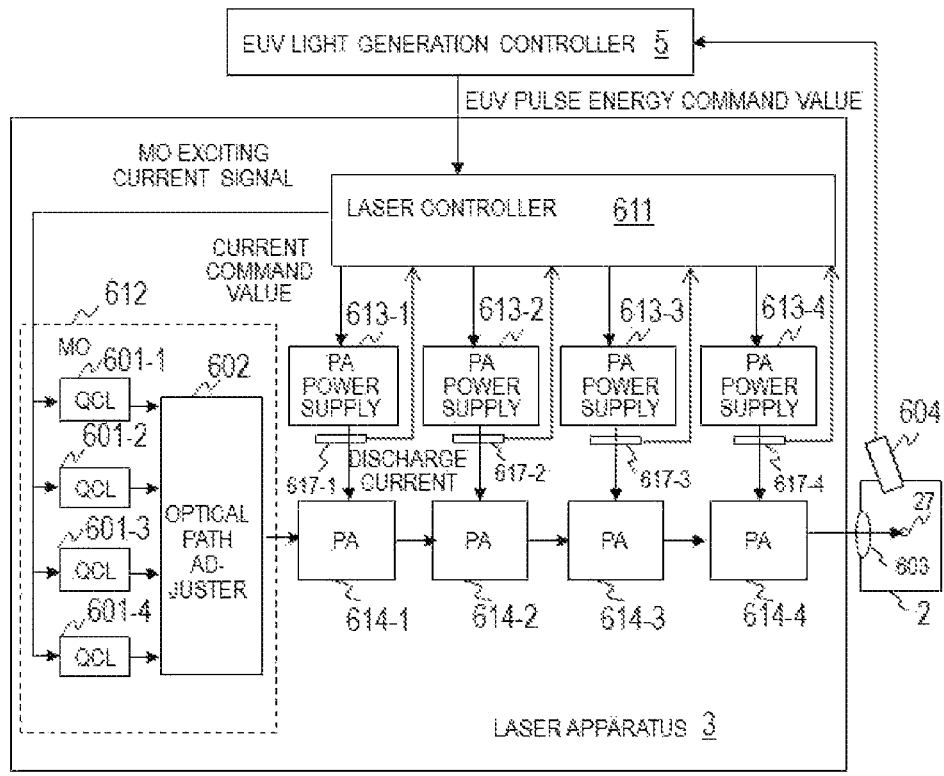
FIG. 28 illustrates a configuration of a laser apparatus in Embodiment 5.

FIG. 28 illustrates a configuration of a laser apparatus 3 in the present embodiment. Discharge current monitors 617-1 to 617-4 may be provided on the individual current connection paths between the optical amplifiers 614-1 to 614-4 and the PA power supplies 613-1 to 613-4. The discharge current monitors 617-1 to 617-4 may be made of a shunt resistor, a CT, or a current probe. In the case where each PA power supply includes a current monitor, the current monitor in the PA power supply may also serve as discharge current monitor. The discharge current monitors 617-1 to 617-4 may be connected with the laser controller 611. The other configuration may be the same as the configuration in FIG. 13.

9.3 Operation

The laser controller 611 may acquire discharge current values from the discharge current monitors 617-1 to 617-4 and rewrite the control information to be set to the PA power supplies 613-1 to 613-4 based on the differences between the current command values and the discharge current values.

Figure 29A:
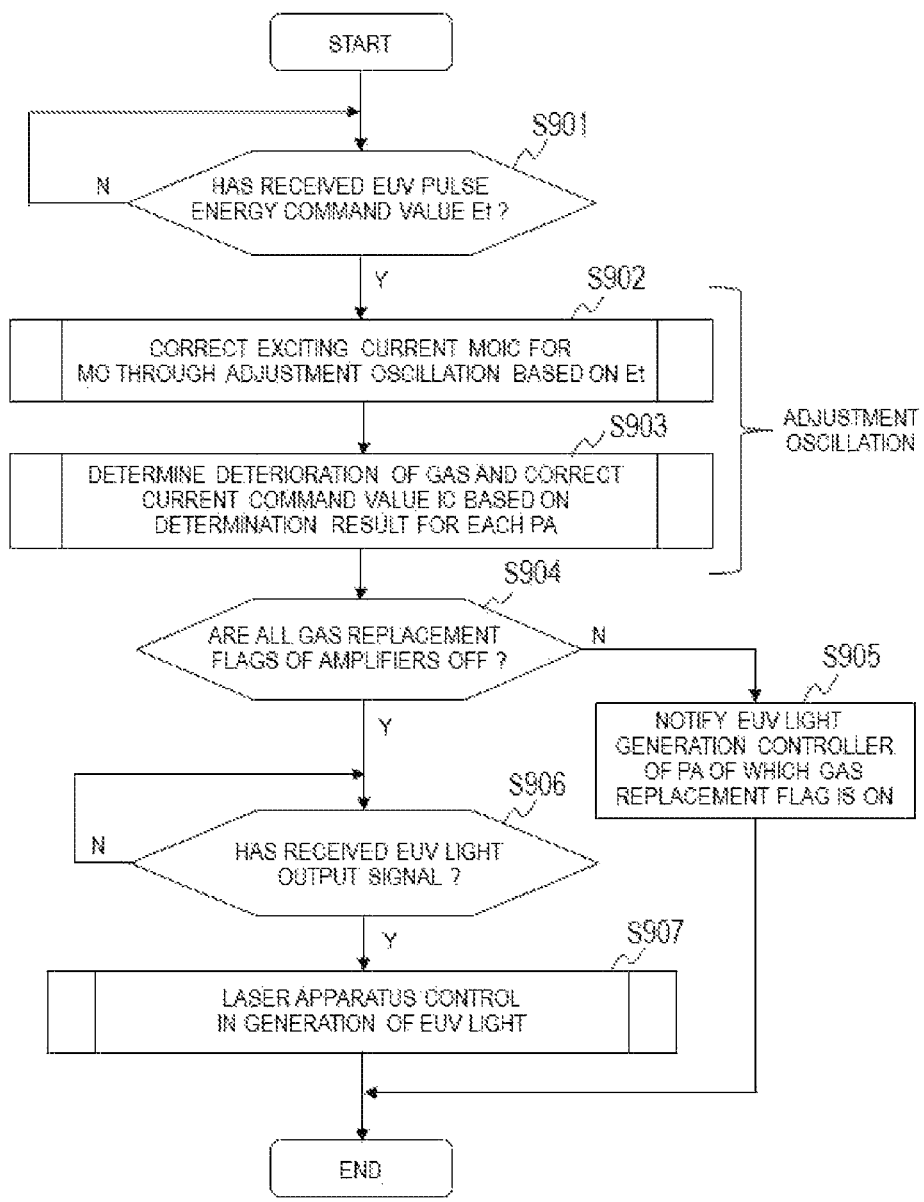
FIG. 29A is a flowchart of operation of a laser controller in Embodiment 5.

FIG. 29A is a flowchart of operation of the laser controller 611 in the present embodiment. The laser controller 611 may stand by until receiving an EUV pulse energy command value Et from the exposure apparatus controller 660 (S901: N).

Upon receipt of an EUV pulse energy command value Et (S901: Y), the laser controller 611 may correct the exciting current MOIC for the master oscillator 612 in the operating parameter table 681 through adjustment oscillation based on the EUV pulse energy command value Et (S902). Step S902 may be the same as Step S202 in FIG. 17.

The laser controller 611 may determine whether the laser gas has deteriorated in each of the optical amplifiers 614-1 to 614-4 through adjustment oscillation and correct the current command values IC for the optical amplifiers 614-1 to 614-4 in the operating parameter table 681 in accordance with the determination results (S903). As will be described later, the laser controller 611 may set a gas replacement flag of the optical amplifier in need of replacement of laser gas to ON. The gas replacement flag may be stored in the storage device of the laser controller 611.

Subsequently, the laser controller 611 may determine whether all the gas replacement flags of the optical amplifiers 614-1 to 614-4 are OFF (S904). If any of the gas replacement flags of the optical amplifiers is ON (S904: N), the laser controller 611 may notify the EUV light generation controller 5 of the optical amplifier(s) of which the gas replacement flag is ON (S905) and terminate the processing.

If all the gas replacement flag of the optical amplifiers 614-1 to 614-4 are OFF (S904: Y), the laser controller 611 may stand by until receiving an EUV light output signal from the exposure apparatus controller 660 (S906: N). Upon receipt of the EUV light output signal from the exposure apparatus controller 660 (S906: Y), the laser controller 611 may start the laser apparatus control in generation of EUV light (S907). Step S907 may be the same as Step S205 in FIG. 17.

Figure 29B:
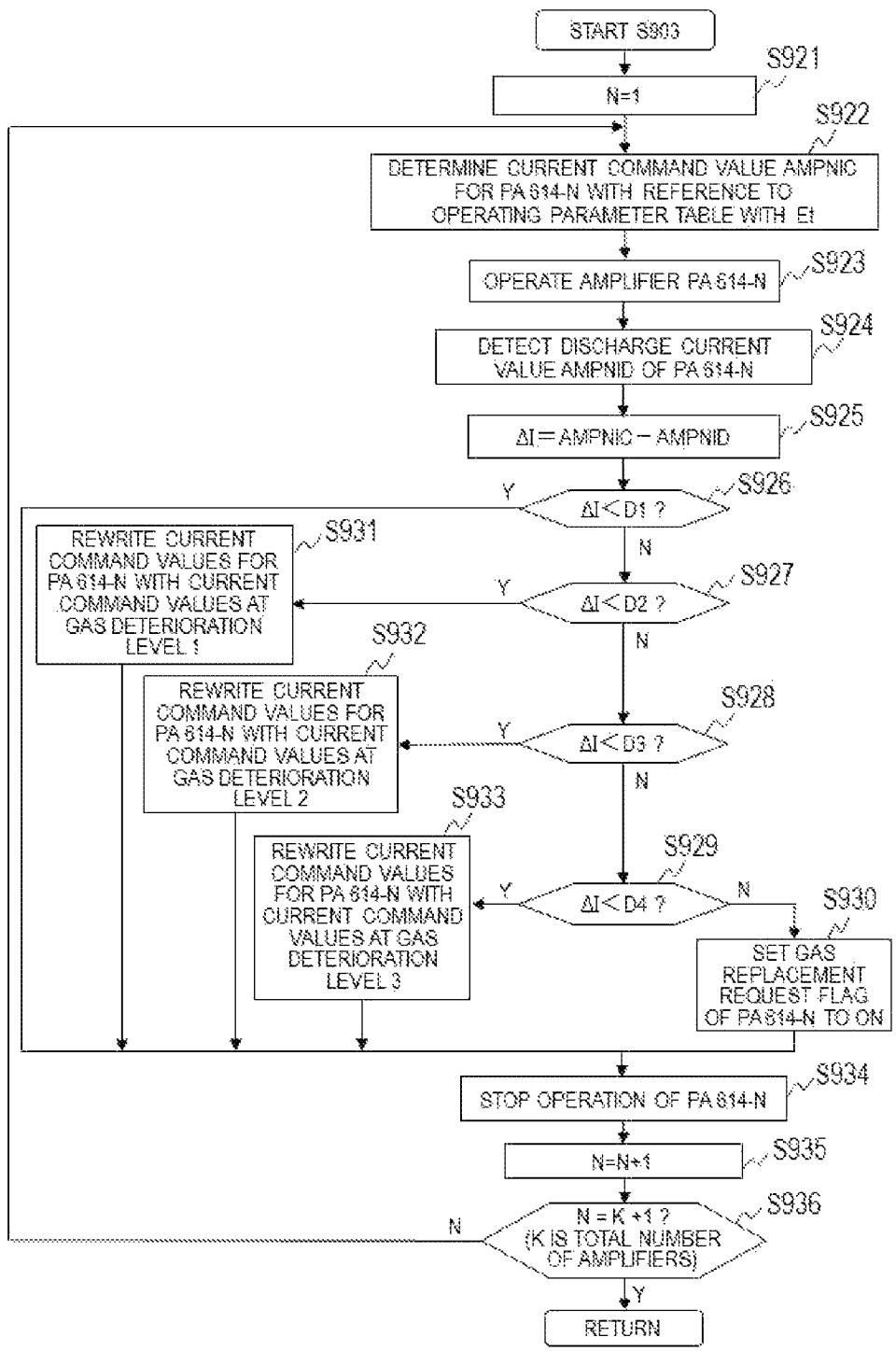
FIG. 29B is a detailed flowchart of determining the deterioration in gas and correcting the operating parameter table in the flowchart of FIG. 29A.

FIG. 29B is a detailed flowchart of determining whether the gas has deteriorated and correcting the operating parameter table 681 (S903) in the flowchart of FIG. 29A. The letter N in the variable names used in the flowchart of FIG. 29B is to be replaced by the value of the variable N.

The laser controller 611 may substitute 1 for the variable N (S921). The laser controller 611 may set the current command value AMPNIC for the optical amplifier 614-N associated with the EUV pulse energy command value Et acquired from the operating parameter table 681 to the optical amplifier 614-N (S922).

Next, the laser controller 611 may activate the optical amplifier 614-N (S923). The laser controller 611 may detect the discharge current value AMPNID of the optical amplifier 614-N with the discharge current monitor 617-N (S924). The laser controller 611 may calculate the difference ΔI between the current command value AMPNIC and the discharge current value AMPNID (S925).

The laser controller 611 may determine a numerical value range including the difference ΔI (S926 to S929). For numerical value ranges, a range lower than a threshold D1, a range from the threshold D1 to a threshold D2, a range from the threshold D2 to a threshold D3, a range from the threshold D3 to a threshold D4, and a range equal to or higher than the threshold D4 may be provided. The relation of D1<D2<D3<D4 may be satisfied among the thresholds.

If the difference ΔI is smaller than the threshold D1 (S926: Y), the laser controller 611 may stop the operation of the optical amplifier 614-N(S934). If the difference ΔI is equal to larger than the threshold D1 and smaller than the threshold D2 (S926: N and S927: Y), the laser controller 611 may determine that the deterioration level of the laser gas is 1. Furthermore, the laser controller 611 may rewrite the current command values for the optical amplifier 614-N in the operating parameter table 681 with the current command values at the gas deterioration level 1 (S931).

FIGS. 30A to 30D are corrected current command value tables 691-1 to 691-4 for the optical amplifiers 614-1 to 614-4 to be consulted to correct the operating parameter table 681. The tables 691-1 to 691-4 may be stored in the storage device of the laser controller 611. The corrected current command value tables 691-1 to 691-4 may store corrected current command values for individual pulse energy command values at each gas deterioration level. The laser controller 611 may acquire data on the row of the gas deterioration level 1 from the corrected current command value table for the optical amplifier 614-N and rewrite the row of the current command value for the optical amplifier 614-N in the operating parameter table 681.

Returning to FIG. 29B, if the difference ΔI is equal to or larger than the threshold D2 and smaller than the threshold D3 (S927: N and S928: Y), the laser controller 611 may determine that the deterioration level of the laser gas is 2. Furthermore, the laser controller 611 may rewrite the current command values for the optical amplifier 614-N in the operating parameter table 681 with the current command values at the gas deterioration level 2 (S932). Specifically, the laser controller 611 may acquire data on the row of the gas deterioration level 2 from the corrected current command value table for the optical amplifier 614-N and rewrite the row of the current command value for the optical amplifier 614-N in the operating parameter table 681.

If the difference ΔI is equal to or larger than the threshold D3 and smaller than the threshold D4 (S928: N and S929: Y), the laser controller 611 may determine that the deterioration level of the laser gas is 3. Furthermore, the laser controller 611 may rewrite the current command values for the optical amplifier 614-N in the operating parameter table 681 with the current command values at the gas deterioration level 3 (S933). Specifically, the laser controller 611 may acquire data on the row of the gas deterioration level 3 from the corrected current command value table for the optical amplifier 614-N and rewrite the row of the current command value for the optical amplifier 614-N in the operating parameter table 681. If the difference ΔI is equal to or larger than the threshold D4 (S929: N), the laser controller 611 may set the gas replacement request flag of the optical amplifier 614-N to ON (S930).

Subsequent to Step S926 and one of Steps S930 to S933, the laser controller 611 may stop the operation of the optical amplifier 614-N(S934). The laser controller 611 may determine whether the correcting of the current command values is completed on all the optical amplifiers. Specifically, the laser controller 611 may increment the variable N (S935) and determine whether the value of the variable N is the same as the value obtained by adding one to the number K of the optical amplifiers (S936).

If correcting the current command values is completed on all the optical amplifiers (S936: Y), the laser controller 611 may exit this process. If any unprocessed optical amplifier remains (S936: N), the laser controller 611 may return to Step S922.

9.4 Effects

The present embodiment may achieve high-speed control of each optical amplifier even if the laser gas in the optical amplifier has deteriorated. The laser controller 611 may detect deterioration of the laser gas in the optical amplifier using a different method without using the discharge current monitor. The laser controller 611 may store the history of the outputs of the energy detector or the EUV sensor to detect deterioration of the gas based on the lowered amount of the laser beam energy or the EUV light energy compared with the previous operation. In the case where a function for calculating the current command value IC is defined instead of the operating parameter table, the laser controller may correct the function.

As set forth above, the present invention has been described with reference to embodiments; the foregoing description is merely provided for the purpose of exemplification but not limitation. Accordingly, it is obvious for a person skilled in the art that the embodiments in this disclosure may be modified within the scope of the appended claims.

A part of the configuration of an embodiment may be replaced with a configuration of another embodiment. A configuration of an embodiment may be incorporated to a configuration of another embodiment. A part of the configuration of each embodiment may be removed, added to a different configuration, or replaced by a different configuration.

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more."

What is claimed is:

1. A laser apparatus configured to generate a pulse laser beam, the laser apparatus comprising:
    a master oscillator configured to output a pulse laser beam;
    an optical amplifier configured to amplify the laser beam outputted from the master oscillator;
    an optical-amplifier power supply configured to supply an alternating current for optical amplification to the optical amplifier; and
    a laser controller configured to control the master oscillator and the optical-amplifier power supply,
    wherein the optical-amplifier power supply includes:
        a power supply control circuit configured to output gate signals with a pulse width corresponding to command values received from the laser controller and,
        an inverter circuit configured to change output amplitude in accordance with the pulse width of the gate signals output from the power supply control circuit, and wherein the optical-amplifier power supply is configured to supply the alternating current with output amplitude corresponding to each command value received from the laser controller.

2. The laser apparatus according to claim 1, wherein the power supply control circuit is configured to hold control information defining correspondence relations between command values from the laser controller and pulse width of gate signals.

3. The laser apparatus according to claim 2, wherein the laser controller is configured to acquire a measured value of output energy of the optical amplifier, calculate a difference between the measured value of the output energy and a target value of the output energy, and correct the control information based on the difference.

4. The laser apparatus according to claim 1, further comprising a current monitor configured to monitor the alternating current,
wherein the laser controller is configured to compare the command value and an output value of the current monitor to determine a deterioration level of laser gas.

5. The laser apparatus according to claim 1, wherein an interface between the laser controller and the power supply control circuit is configured with parallel I/O.

6. An EUV light generation system configured to irradiate a target with a pulse laser beam to generate EUV light, the EUV light generation system comprising:
a chamber;
a target supply device configured to supply a target into the chamber; and
a laser apparatus configured to output a pulse laser beam with which the target supplied into the chamber is to be irradiated,
wherein K is an integer equal to or greater than two,
wherein the laser apparatus includes:
a master oscillator configured to output a pulse laser beam;
K stages of optical amplifiers configured to amplify a pulse laser beam outputted from the master oscillator;
K optical-amplifier power supplies configured to supply alternating currents to the K stages of optical amplifiers, and
a laser controller configured to control the master oscillator and the K optical-amplifier power supplies,
wherein each of a part of the optical amplifiers including the K-th stage optical amplifier includes:
a power supply control circuit configured to output gate signals with pulse width corresponding to command values received from the laser controller; and
an inverter circuit configured to change output amplitude in accordance with the pulse width of the gate signals output from the power supply control circuit, and
wherein each of the part of the optical amplifiers including the K-th stage optical amplifier is configured to supply the alternating current corresponding to each command value received from the laser controller.

7. The EUV light generation system according to claim 6, wherein an exciting frequency of each of the K stages of optical amplifiers is equal to or higher than an EUV light generation frequency.

8. The EUV light generation system according to claim 7, wherein the laser controller is configured to:
calculate a difference between a measured value of energy of EUV light in the chamber and a target value of the EUV light; and
correct command values for the part of the optical amplifiers based on the difference.

9. The EUV light generation system according to claim 8, wherein the power supply control circuit is configured to hold control information defining correspondence relations between command values from the laser controller and pulse width of gate signals.

10. The EUV light generation system according to claim 9, wherein the laser controller is configured to acquire a measured value of output energy of each of the part of the optical amplifiers, calculate a difference between the measured value of the output energy and a target value of the output energy, and correct the control information based on the difference.

11. The EUV light generation system according to claim 7,
wherein the laser controller is configured to:
calculate a difference between a measured value of energy of EUV light in the chamber and a target value of the EUV light;
correct only a command value for the K-th stage optical amplifier based on the difference in a case where the difference is equal to or smaller than a threshold; and
correct command values for a plurality of optical amplifiers including the K-th stage optical amplifier in a case where the difference is larger than the threshold.

12. The EUV light generation system according to claim 11, wherein, correcting the command values for the plurality of optical amplifiers including the K-th stage optical amplifier, compensations in command values for the optical amplifiers different from the K-th stage optical amplifier are fixed independent from the difference.

13. The EUV light generation system according to claim 7, further comprising a current monitor configured to monitor the alternating current,
wherein the laser controller is configured to compare the command value and an output value of the current monitor to determine a deterioration level of laser gas.

14. The EUV light generation system according to claim 7, wherein an interface between the laser controller and the power supply control circuit is configured with parallel I/O.

15. A control method for a laser apparatus configured to generate a pulse laser beam,
the laser apparatus including:
a master oscillator configured to output a pulse laser beam;
an optical amplifier configured to amplify the laser beam outputted from the master oscillator; and
an optical-amplifier power supply configured to supply an alternating current generated to the output of the optical amplifier,
the control method comprising:
acquiring a command value for the optical-amplifier power supply;
create a gate signal with pulse width corresponding to the command value;
changing output amplitude of the alternating current in accordance with the pulse width of the gate signal; and
supplying the alternating current with output amplitude corresponding to each newly received command value.

* * * * *